(12) United States Patent
Lee et al.

(10) Patent No.: US 10,818,689 B2
(45) Date of Patent: Oct. 27, 2020

(54) THREE-DIMENSIONAL SEMICONDUCTOR MEMORY DEVICE AND METHOD OF FABRICATING THE SAME

(71) Applicant: SAMSUNG ELECTRONICS CO., LTD., Suwon-si, Gyeonggi-do (KR)

(72) Inventors: Kyunghwan Lee, Hwaseong-si (KR); Changseok Kang, Seongnam-si (KR); Yongseok Kim, Suwon-si (KR); Junhee Lim, Seoul (KR); Kohji Kanamori, Seoul (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 16/232,549

(22) Filed: Dec. 26, 2018

(65) Prior Publication Data
US 2019/0312052 A1 Oct. 10, 2019

(30) Foreign Application Priority Data
Apr. 4, 2018 (KR) .................. 10-2018-0039228

(51) Int. Cl.
| | |
|---|---|
| *H01L 27/11582* | (2017.01) |
| *H01L 27/11565* | (2017.01) |
| *H01L 27/1157* | (2017.01) |
| *H01L 29/423* | (2006.01) |
| *H01L 21/311* | (2006.01) |

(Continued)

(52) U.S. Cl.
CPC ... *H01L 27/11582* (2013.01); *H01L 21/31111* (2013.01); *H01L 21/31144* (2013.01); *H01L 27/1157* (2013.01); *H01L 27/11565* (2013.01); *H01L 27/11573* (2013.01); *H01L 29/40117* (2019.08); *H01L 29/4234* (2013.01)

(58) Field of Classification Search
None
See application file for complete search history.

(56) References Cited

U.S. PATENT DOCUMENTS

| | | |
|---|---|---|
| 8,552,489 B2 | 10/2013 | Eom et al. |
| 8,643,084 B2 | 2/2014 | Shin et al. |

(Continued)

FOREIGN PATENT DOCUMENTS

| | | |
|---|---|---|
| JP | 2015028982 | 2/2015 |
| KR | 1020130059821 | 6/2013 |
| KR | 101778287 | 9/2017 |

*Primary Examiner* — Khaja Ahmad
(74) *Attorney, Agent, or Firm* — F. Chau & Associates, LLC

(57) ABSTRACT

Provided are three-dimensional semiconductor memory devices and methods of fabricating the same. The three-dimensional semiconductor memory device includes a plurality of electrode structures provided on a substrate and extending in parallel to each other in one direction and each including electrodes and insulating layers alternately stacked on the substrate, a plurality of vertical structures penetrating the plurality of electrode structures, and an electrode separation structure disposed between two of the plurality of electrode structures adjacent to each other. Each of the electrodes includes an outer portion adjacent to the electrode separation structure, and an inner portion adjacent to the plurality of vertical structures. A thickness of the outer portion is smaller than a thickness of the inner portion.

20 Claims, 39 Drawing Sheets

(51) Int. Cl.
*H01L 27/11573* (2017.01)
*H01L 21/28* (2006.01)

(56) References Cited

U.S. PATENT DOCUMENTS

| | | | |
|---|---|---|---|
| 8,685,821 B2 | 4/2014 | Eom et al. | |
| 8,822,322 B2 | 9/2014 | Lee et al. | |
| 9,082,826 B2 | 7/2015 | Chandrashekar et al. | |
| 9,196,627 B2 | 11/2015 | Konno et al. | |
| 9,356,031 B2 | 5/2016 | Lee et al. | |
| 9,455,263 B2 | 9/2016 | Zhang et al. | |
| 10,256,247 B1* | 4/2019 | Kanakamedala | H01L 29/7926 |
| 2011/0147824 A1* | 6/2011 | Son | G11C 16/0483 |
| | | | 257/324 |
| 2011/0298038 A1* | 12/2011 | Son | H01L 27/11578 |
| | | | 257/324 |
| 2011/0303971 A1* | 12/2011 | Lee | H01L 27/11551 |
| | | | 257/324 |
| 2017/0018563 A1* | 1/2017 | Nishida | H01L 27/11582 |
| 2017/0236831 A1* | 8/2017 | Kim | H01L 21/31105 |
| | | | 438/269 |
| 2018/0219021 A1* | 8/2018 | Daycock | H01L 29/7926 |

* cited by examiner

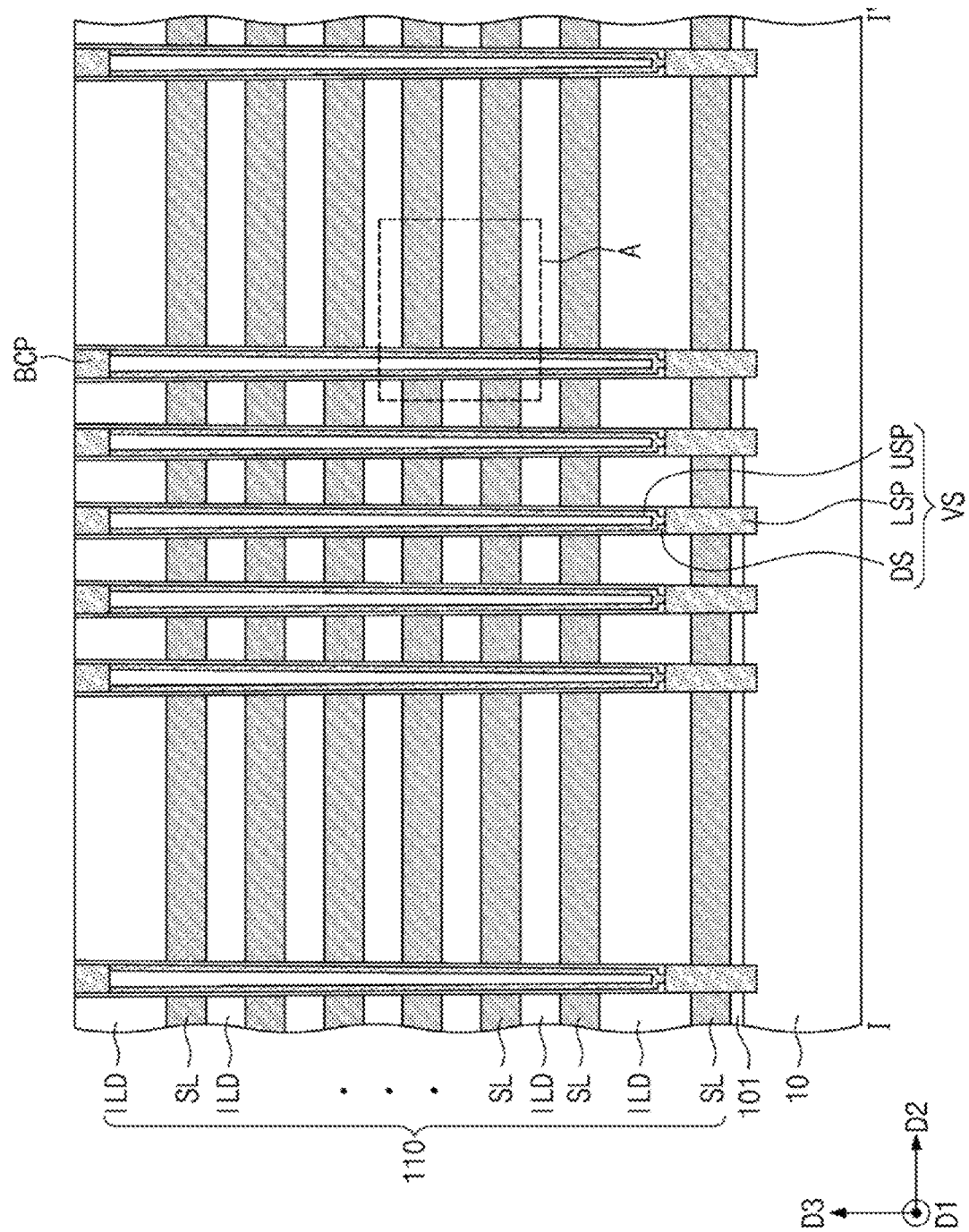

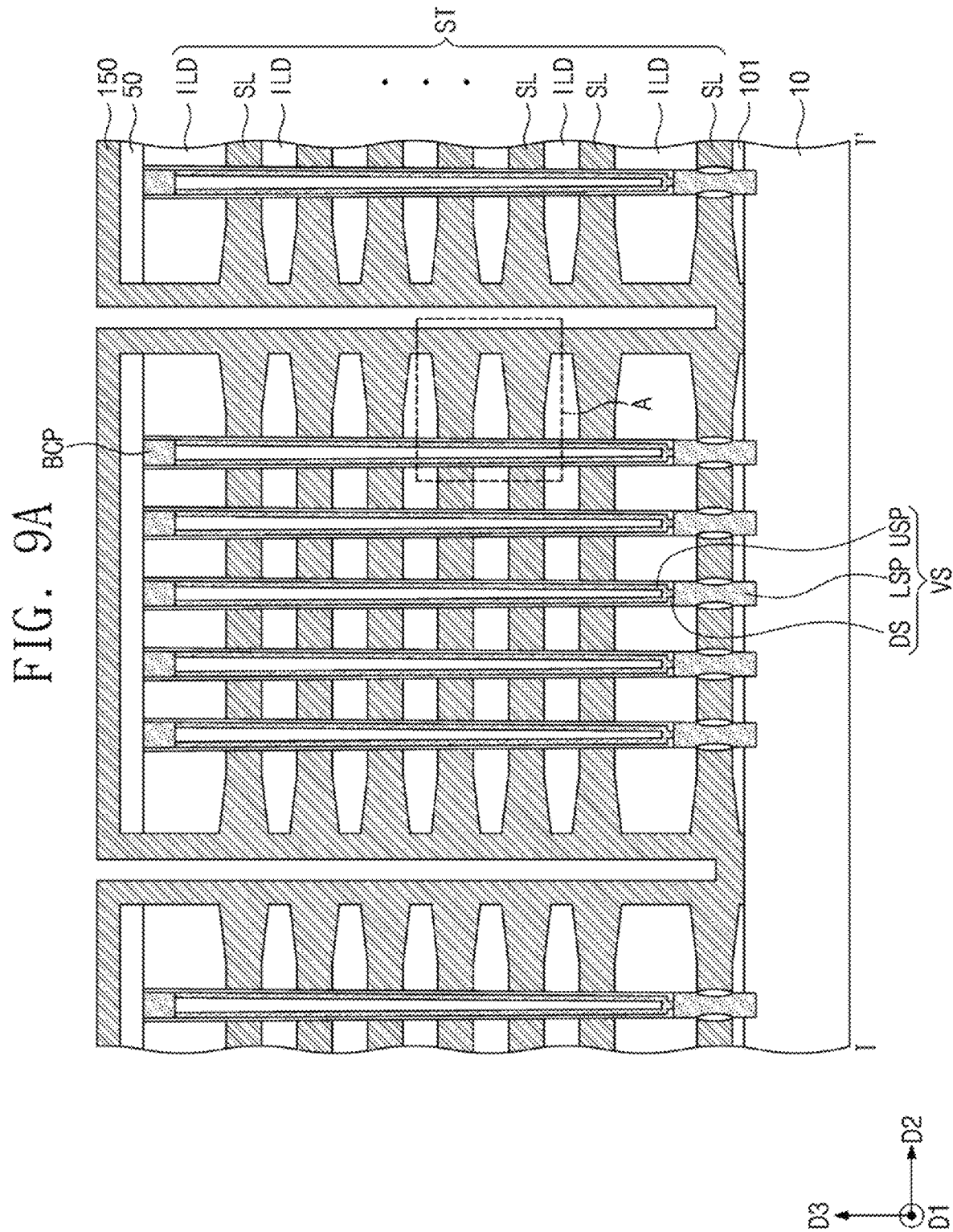

THREE-DIMENSIONAL SEMICONDUCTOR MEMORY DEVICE AND METHOD OF FABRICATING THE SAME

CROSS-REFERENCE TO RELATED APPLICATION

This U.S. nonprovisional application claims priority under 35 U.S.C. § 119 to Korean Patent Application No. 10-2018-0039228, filed on Apr. 4, 2018, in the Korean Intellectual Property Office, the entire contents of which are incorporated by reference herein.

TECHNICAL FIELD

The present inventive concept relates to a three-dimensional semiconductor memory device and a method of fabricating the same, and more particularly, to a three-dimensional semiconductor memory device with enhanced reliability and electrical characteristics and a method of fabricating the same.

DISCUSSION OF RELATED ART

Recently, semiconductor devices have been highly integrated to satisfy customer demands for high performance and low manufacture costs. The integration of typical two-dimensional or planar semiconductor memory devices is primarily determined by the area occupied by a unit memory cell, and therefore is greatly influenced by the level of technology for forming fine patterns. However, the extremely expensive processing equipment needed to increase pattern fineness may set a practical limit on increasing the integration for the two-dimensional or planar semiconductor memory devices. Therefore, three-dimensional semiconductor memory devices having three-dimensionally arranged memory cells have been proposed.

SUMMARY

Exemplary embodiments of the present inventive concept provide a three-dimensional semiconductor memory device with enhanced reliability and electrical characteristics, and a method of fabricating the same.

According to an exemplary embodiment of the present inventive concept, a three-dimensional semiconductor memory device may include: a plurality of electrode structures provided on a substrate and extending in parallel to each other in one direction, each of the plurality of electrode structures including electrodes and insulating layers alternately stacked on the substrate; a plurality of vertical structures penetrating the plurality of electrode structures; and an electrode separation structure disposed between two of the plurality of electrode structures adjacent to each other. Each of the electrodes may include: an outer portion adjacent to the electrode separation structure; and an inner portion adjacent to the plurality of vertical structures. A thickness of the outer portion may be smaller than a thickness of the inner portion.

According to an exemplary embodiment of the present inventive concept, a three-dimensional semiconductor memory device may include: an electrode structure including electrodes and insulating layers alternately stacked on a substrate, each of the electrodes including an outer portion horizontally protruding from sidewalls of the insulating layers; and a plurality of vertical structures penetrating the electrode structure. Each of the electrodes may include: a metal pattern; and a barrier metal pattern that extends from a gap between each of the plurality of vertical structures and a sidewall of the metal pattern into gaps between the insulating layers and the metal pattern. A thickness of the metal pattern at the outer portion of each of the electrodes may be smaller than a thickness of the metal pattern between the insulating layers.

According to an exemplary embodiment of the present inventive concept, a three-dimensional semiconductor memory device may include: a plurality of electrode structures extending in parallel to each other in a first direction on a substrate, each of the plurality of electrode structures including electrodes vertically stacked on the substrate; a plurality of vertical structures penetrating the plurality of electrode structures; and an electrode separation structure spaced apart from the plurality of vertical structures and on the substrate between two of the plurality of electrode structures adjacent to each other. Each of the electrodes may include: an outer portion adjacent to the electrode separation structure, and an inner portion adjacent to the plurality of vertical structures. A distance between the outer portions of the electrodes vertically adjacent to each other may be greater than a distance between the inner portions of the electrodes vertically adjacent to each other.

According to an exemplary embodiment of the present inventive concept, a method of fabricating a three-dimensional semiconductor memory device may include: forming on a substrate a thin-layer structure where sacrificial layers and insulating layers are alternately stacked; forming a vertical structure penetrating the thin-layer structure; forming a trench spaced apart from the vertical structure and penetrating the thin-layer structure; forming gate regions between the insulating layers by removing the sacrificial layers through the trench; forming preliminary gate electrodes in the gate regions; forming recess regions partially exposing the preliminary gate electrodes by recessing sidewalls of the insulating layers exposed to the trench; and forming gate electrodes by isotropically etching the preliminary gate electrodes exposed to the recess regions.

BRIEF DESCRIPTION OF THE DRAWINGS

Exemplary embodiments of the present inventive concept will be more clearly understood from the following detailed description taken in conjunction with the accompanying drawings, in which:

FIGS. 6A to 13A are cross-sectional views taken along line I-I' of FIG. 1, showing a method of fabricating a three-dimensional semiconductor memory device according to an exemplary embodiment of the present inventive concept;

FIGS. 6B to 13B are cross-sectional views of section A of FIGS. 6A to 13A, respectively, showing a method of fabricating a three-dimensional semiconductor memory device according to an exemplary embodiment of the present inventive concept;

FIGS. 14, 15, 16A to 18A, and 16B to 18B are cross-sectional views of section A of FIG. 2, showing a method of fabricating a three-dimensional semiconductor memory device according to an exemplary embodiment of the present inventive concept.

Figure 1:
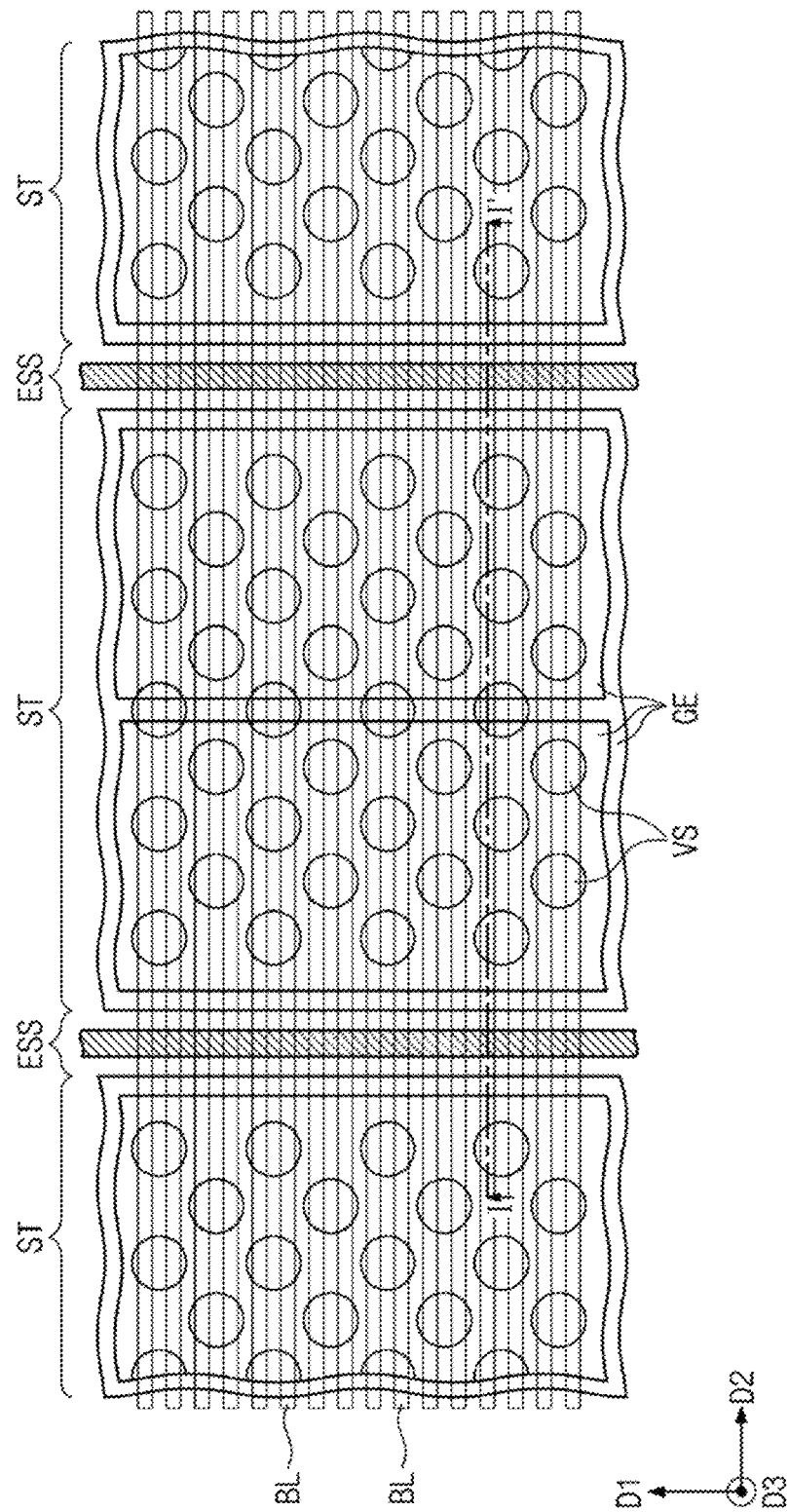
FIG. 1 is a plan view showing a cell array of a three-dimensional semiconductor memory device according to an exemplary embodiment of the present inventive concept.

Since the drawings in FIGS. 1-21 are intended for illustrative purposes, the elements in the drawings are not necessarily drawn to scale. For example, some of the elements may be enlarged or exaggerated for clarity purpose.

DETAILED DESCRIPTION OF THE EMBODIMENTS

Exemplary embodiments of the present inventive concept will be described below in detail in conjunction with the accompanying drawings.

Figure 2:
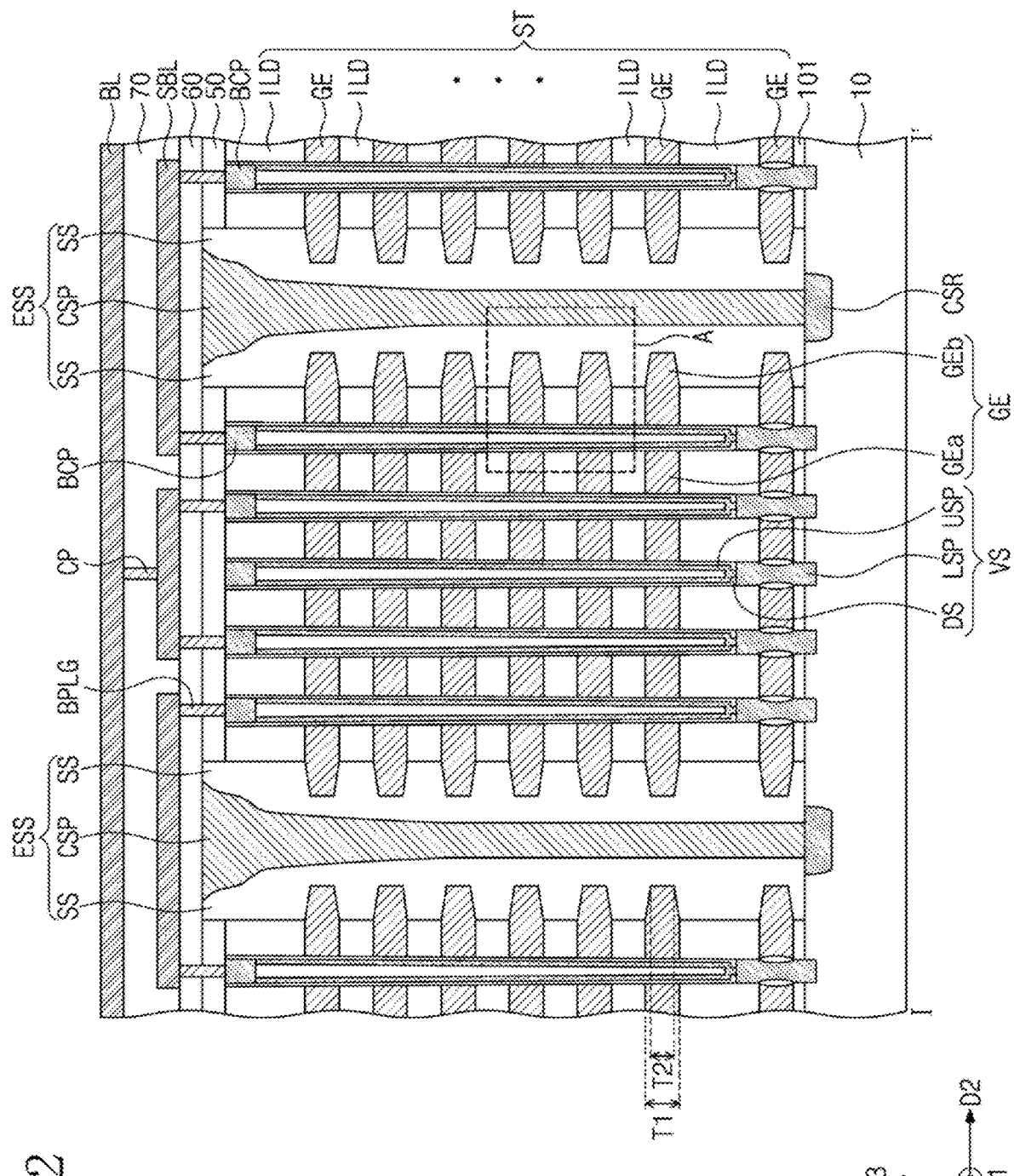
FIG. 2 is a cross-sectional view taken along line I-I' of FIG. 1, showing a three-dimensional semiconductor memory device according to an exemplary embodiment of the present inventive concept.

FIG. 1 is a plan view showing a cell array of a three-dimensional semiconductor memory device according to an exemplary embodiment of the present inventive concept. FIG. 2 is a cross-sectional view taken along line I-I' of FIG. 1, showing a three-dimensional semiconductor memory device according to an exemplary embodiment of the present inventive concept. FIGS. 3A to 3H are cross-sectional views of section A of FIG. 2, each showing a three-dimensional semiconductor memory device according to an exemplary embodiment of the present inventive concept.

Referring to FIGS. 1 and 2, a plurality of electrode structures ST may be disposed on a substrate 10. The plurality of electrode structures ST may extend in parallel in a first direction D1, and electrode separation structures ESS may be disposed on the substrate 10 to separate the electrode structures ST from each other in a second direction D2 perpendicular to the first direction D1. The first and second directions D1 and D2 may be parallel to a top surface of the substrate 10.

The substrate 10 may include one of a material having semiconductor characteristics (e.g., silicon (Si)), an insulating material (e.g., silicon oxide ($SiO_2$)), and a conductor or semiconductor covered with an insulating material. For example, the substrate 10 may be a silicon (Si) wafer having a first conductivity type. Alternatively, the substrate 10 may include, for example, a germanium (Ge) wafer, a silicon-germanium (Ge) wafer, a III-V compound semiconductor wafer, or a glass substrate. A buffer insulating layer 101 may be interposed between the electrode structures ST and the substrate 10, and may include a silicon oxide layer. The buffer insulating layer 101 may be formed through thermal oxidation of the silicon substrate 10 to form the silicon oxide layer or through deposition of the silicon oxide layer to cover the substrate 10.

Each of the electrode structures ST may include a plurality of gate electrodes GE and a plurality of insulating layers ILD alternately stacked along a third direction D3 perpendicular to the first and second directions D1 and D2. Each of the electrode structures ST may include select gate electrodes that are provided as a pair at an uppermost level. The select gate electrodes may be spaced apart from each other in the second direction D2. In an exemplary embodiment of the present inventive concept, a three-dimensional semiconductor memory device may be a vertical NAND Flash memory device, and the gate electrodes GE of each of the electrode structures ST may serve as gate electrodes for a string select transistor, memory cell transistors, and a ground select transistor, in which these transistors constitute a NAND cell string. The memory cell transistors may be disposed between the ground and string select transistors. The ground select transistor, the string select transistor, and the memory cell transistors may be connected in series.

The gate electrodes GE may have substantially the same thickness, and thicknesses of the insulating layers ILD may be different depending on characteristics of a semiconductor memory device. For example, the insulating layers ILD may have one or more thicker than the others, with the others having the same thickness. Here, the thicknesses are measured in the third direction D3. For other examples, a thickness of a film may be measured in a direction, which may be different from the third direction D3, perpendicular to a surface which the film is deposited on. The gate electrodes GE may include, for example, at least one selected from doped semiconductor (e.g., doped silicon (Si)), metal (e.g., tungsten (W), copper (Cu), or aluminum (Al)), conductive metal nitride (e.g., titanium nitride (TiN) or tantalum nitride (TaN)), and transition metal (e.g., titanium (Ti) or tantalum (Ta)). The insulating layers ILD may include, for example, a silicon oxide ($SiO_2$) layer or a low-k dielectric layer.

Each of the electrode structures ST may be disposed between a pair of electrode separation structures ESS and may have opposite sidewalls adjacent to the electrode separation structures ESS. The gate electrodes GE may have sidewalls offset in the second direction D2 toward the adjacent electrode separation structure ESS from sidewalls of the insulating layers ILD, and the opposite sidewalls of the electrode structure ST may have recess regions defined between the protruding part of the gate electrodes GE vertically adjacent to each other. For example, the sidewalls of the insulating layers ILD may be spaced apart from a sidewall of a common source plug CSP, which is included in the electrode separation structure, by a first distance in the second direction D2 parallel to the top surface of the substrate 10, and the sidewalls of the gate electrodes GE may be spaced apart from the sidewall of the common source plug CSP in the second direction D2 by a second distance smaller than the first distance. The gate electrodes GE may have widths in the second direction D2 greater than those of the insulating layers LD.

Figure 3A:
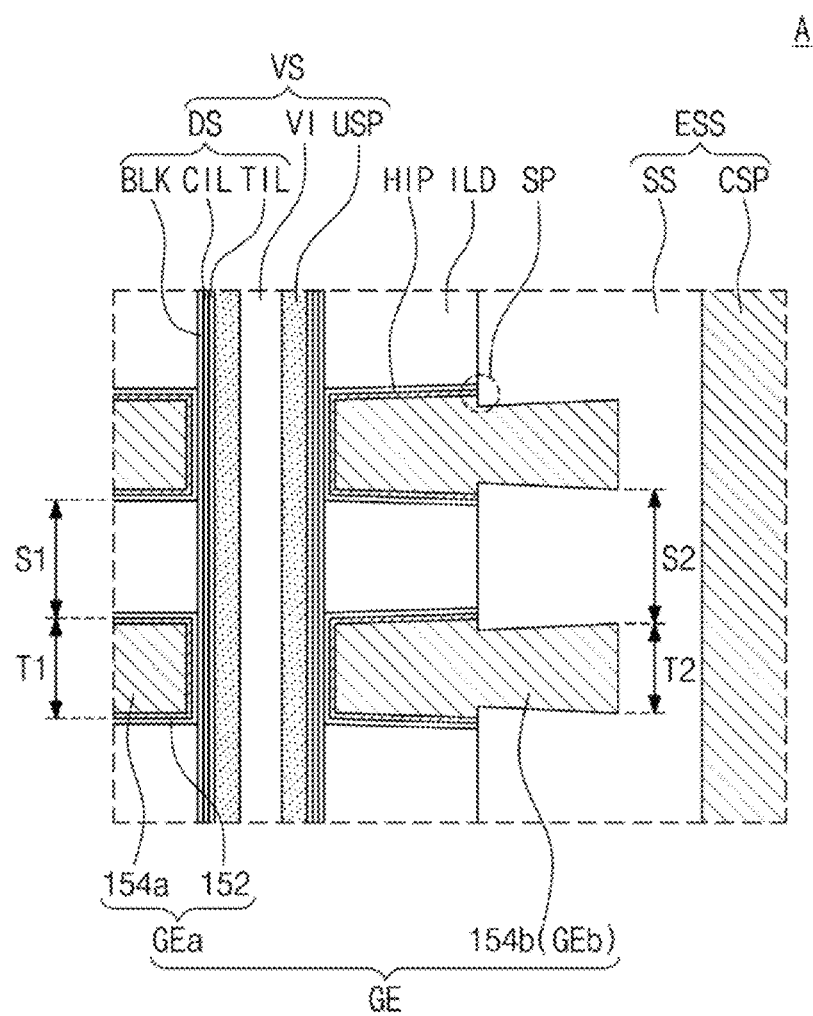
FIGS. 3A to 3H are cross-sectional views of section A of FIG. 2, each showing a three-dimensional semiconductor memory device according to an exemplary embodiment of the present inventive concept.

Referring to FIGS. 2 and 3A, each of the gate electrodes GE may include an inner portion GEa adjacent to a vertical structure VS and an outer portion GEb adjacent to the electrode separation structure ESS. The vertical structure VS may extend in the third direction D3 and spaced apart from the electrode separation structure ESS in the second direction D2. For example, the inner portion GEa of the gate electrode GE may be placed between the insulating layers ILD, and the outer portion GEb of the gate electrode GE may protrude in the second direction D2 from the sidewalls of the insulating layers ILD.

The inner portion GEa of the gate electrode GE may have a first thickness T1, and the outer portion GEb of the gate electrode GE may have a second thickness T2 equal to or smaller than the first thickness T1. The first thickness T1 of the inner portion GEa of the gate electrode GE may be substantially uniform. The outer portion GEb of the gate electrode GE may have a thickness that gradually becomes smaller or larger toward the common source plug CSP. The gate electrodes GE may be spaced apart at an interval that is greater between the outer portions GEb than between the inner portions GEa (S1<S2). For example, the outer portions GEb of the gate electrodes GE may have sloped top and bottom surfaces. Thus, an increase in capacitive coupling between the outer portions GEb of the gate electrodes GE may be prevented. Accordingly, preventing reduction of breakdown voltage of the insulators between the outer portions GEb of the gate electrodes GE may be achieved. As a result, a three-dimensional semiconductor memory device according to an exemplary embodiment of the present inventive concept with enhanced reliability and electrical characteristics may be obtained. The gate electrodes GE will be further discussed in detail with reference to FIGS. 3A to 3H.

A plurality of vertical structures VS may extend in the third direction D3 perpendicular to the top surface of the substrate 10, while penetrating each of the electrode structures ST. When viewed in plan, the vertical structures VS may be arranged in a zigzag fashion along the first and second directions D1 and D2.

Each of the vertical structures VS may include a vertical semiconductor pattern LSP and USP that penetrates the electrode structure ST and is connected to the substrate 10, and may also include a data storage pattern DS interposed between the electrode structure ST and the vertical semiconductor pattern LSP and USP. Each of the vertical structures VS may be provided on its top end with a bit line conductive pad BCP including a conductive material. For example, the bit line conductive pad BCP may include an impurity-doped semiconductor material.

The vertical semiconductor pattern LSP and USP may include a semiconductor material, such as, for example, silicon (Si), germanium (Ge), or a mixture thereof. The vertical semiconductor pattern LSP and USP may serve as channels of ground and string select transistors and of memory cell transistors in a vertical NAND Flash memory device. The vertical semiconductor pattern LSP and USP may include a lower semiconductor pattern LSP that penetrates a lower portion of the electrode structure ST and contacts the substrate 10, and may also include an upper semiconductor pattern USP that penetrates an upper portion of the electrode structure ST and contacts the lower semiconductor pattern LSP. The lower semiconductor pattern LSP may have a bottom surface lower than a top surface of the substrate 10 and a top surface higher than a top surface of a lowermost gate electrode GE. The lower semiconductor pattern LSP may be an epitaxial pattern and may have a pillar shape. The epitaxial pattern of the lower semiconductor pattern LSP may be formed by using the substrate 10 as a seed. The upper semiconductor pattern USP may have a macaroni shape, a pipe shape whose bottom end is closed, or a U shape defining an empty space therein, in which empty space may be filled with a buried insulating pattern (see VI of FIG. 3A). Alternatively, the empty space may not be filled with the buried insulating pattern VI, and each of the vertical structures VS may include a hollow space or an air gap in the empty space defined by the upper semiconductor pattern USP.

The data storage pattern DS may include, as shown in FIGS. 3A to 3H, a tunnel insulating layer TIL, a charge storage layer CIL, and a blocking insulating layer BLK, in which layers TIL, CIL, and BLK constitute a data storage layer of a vertical NAND Flash memory device. A horizontal insulating pattern HIP may extend onto top and bottom surfaces of the gate electrode GE from a gap between the gate electrode GE and the vertical structure VS. For example, the horizontal insulating pattern HIP may extend between the vertical structure VS and a sidewall of the gate electrode GE and may cover the top and bottom surfaces of the inner portion GEa of the gate electrode GE.

Common source regions CSR may be provided in the substrate 10 between the electrode structures ST. The common source regions CSR may extend in the first direction D parallel to the extending directions of the electrode structures ST and may be spaced apart from each other in the second direction D2. When viewed in plan, each of the electrode structures ST may be disposed between the common source regions CSR adjacent to each other. For example, the common source regions CSR may be formed by doping the substrate 10 having the first conductivity type with impurities having a second conductivity type, for example, N-type impurities such as arsenic (As) or phosphorous (P).

The electrode separation structures ESS may be correspondingly disposed between the electrode structures ST and may cover opposite sidewalls of each of the electrode structures ST. The electrode separation structures ESS may extend in the first direction D1 parallel to the extending directions of the electrode structures ST and may be spaced apart from each other in the second direction D2. Each of the electrode separation structures ESS may include the common source plug CSP and insulating spacers SS. The common source plug CSP may be coupled to the common source region CSR and may have a linear shape extending in the first direction D1. The insulating spacers SS may be disposed between the common source plug CSP and the sidewalls of the electrode structures ST. The insulating spacers SS may fill the recess regions defined on the opposite sidewalls of each of the electrode structures ST. For example, the sidewalls of the insulating layers ILD may be recessed to define the recess regions between the outer portions GEb of the gate electrodes GE, and the insulating spacers SS may fill the recess regions and may cover the sidewalls of the electrode structures ST. The insulating spacers SS may directly contact top and bottom surfaces of each of the outer portions GEb of the gate electrodes GE. For example, the insulating spacer SS may horizontally protrude between the outer portions GEb of the gate electrodes GE adjacent to each other. The insulating spacers SS may include a silicon oxide layer or a low-k dielectric layer whose dielectric constant is lower than that of the insulating layers ILD. For example, the insulating spacers SS disposed between the outer portions GEb of the gate electrodes GE adjacent to each other may have a dielectric constant smaller than a dielectric constant of the insulating layers ILD disposed between the inner portions GEa of the gate electrodes GE adjacent to each other.

The electrode structures ST may be provided thereon with a first interlayer dielectric layer 50 covering top surfaces of the vertical structures VS. Since each of the vertical structures VS may be provided on its top end with a bit line conductive pad BCP, the first interlayer dielectric layer 50 may cover top surfaces of the bit line conductive pads BCP. The first interlayer dielectric layer 50 may be provided thereon with a second interlayer dielectric layer 60 covering top surfaces of the electrode separation structures ESS.

The second interlayer dielectric layer 60 may be provided thereon with subsidiary bit lines SBL electrically connected to the vertical structures VS through bit line contact plugs BPLG that are formed in the first and second interlayer dielectric layers 50 and 60. The second interlayer dielectric layer 60 may be provided thereon with a third interlayer dielectric layer 70 covering the subsidiary bit lines SBL. The third interlayer dielectric layer 70 may be provided thereon with bit lines BL running across the electrode structure ST and extending in the second direction D2. The bit lines BL may be coupled to the subsidiary bit lines SBL through contact plugs CP that are formed in the third interlayer dielectric layer 70.

The gate electrodes GE will be further discussed below in detail with reference to FIGS. 3A to 3H.

As discussed with reference to FIG. 2, each of the gate electrodes GE may include the inner portion GEa adjacent to the vertical structure VS and the outer portion GEb adjacent to the electrode separation structure ESS.

Referring to FIGS. 3A to 3H, each of the gate electrodes GE may include a barrier metal pattern 152 and a metal pattern 154a and 154b sequentially stacked. The barrier metal pattern 152 may include metal nitride, such as, for example, titanium nitride (TiN), tantalum nitride (TaN), or tungsten nitride (WN). The metal pattern 154a and 154b may include a metallic material, such as, for example, tungsten (W), aluminum (Al), titanium (Ti), tantalum (Ta), cobalt (Co), or copper (Cu).

The metal pattern 154a and 154b may include a first portion 154a disposed between the insulating layers ILD and a second portion 154b horizontally protruding from the sidewall of the insulating layer ILD.

The barrier metal pattern 152 may have a substantially uniform thickness and a sidewall horizontally spaced apart from a sidewall of the metal pattern 154a and 154b. The sidewall of the barrier metal pattern 152 may align with the sidewalls of the insulating layers ILD. For example, unlike the second portion 154b of the metal pattern 154a and 154b, the barrier metal pattern 152 may not horizontally protrude from the sidewalls of the insulating layers ILD. The barrier metal pattern 152 may extend from a gap between the vertical structure VS and the sidewall of the first portion 154a toward gaps between top and bottom surfaces of the first portion 154a and the insulating layers ILD. The horizontal insulating pattern HIP may be disposed between the barrier metal pattern 152 and the insulating layers ILD. The horizontal insulating pattern HIP may include a blocking insulating layer that corresponds to a portion of a data storage layer, which may include a tunnel insulating layer TIL, a charge storage layer CIL, and a blocking insulating layer BLK, for a NAND Flash memory device.

Referring to FIGS. 3A to 3E, the inner portion GEa of the gate electrode GE may have a first thickness T1, and the outer portion GEb of the gate electrode GE may have a second thickness T2 equal to or smaller than the first thickness T1. The gate electrodes GE may be spaced apart at an interval that is greater between the outer portions GEb than between the inner portions GEa (S1<S2). For example, a distance (S2) between the outer portions GEb of the gate electrodes GE vertically adjacent to each other may be greater than a distance (S1) between the inner portions GEa of the gate electrodes GE vertically adjacent to each other. Accordingly, a thickness (S2) of insulators disposed between the outer portions GEb of the gate electrodes GE may be greater than a thickness (S1) of insulators disposed between the inner portions GEa of the gate electrodes GE. The metal pattern 154a and 154b may be configured such that the first portion 154a may have a thickness greater than that of the second portion 154b. In an exemplary embodiment of the present inventive concept, the metal pattern 154a and 154b may have a stepped portion SP caused by a difference in thickness between the first and second portions 154a and 154b.

Figure 3B:
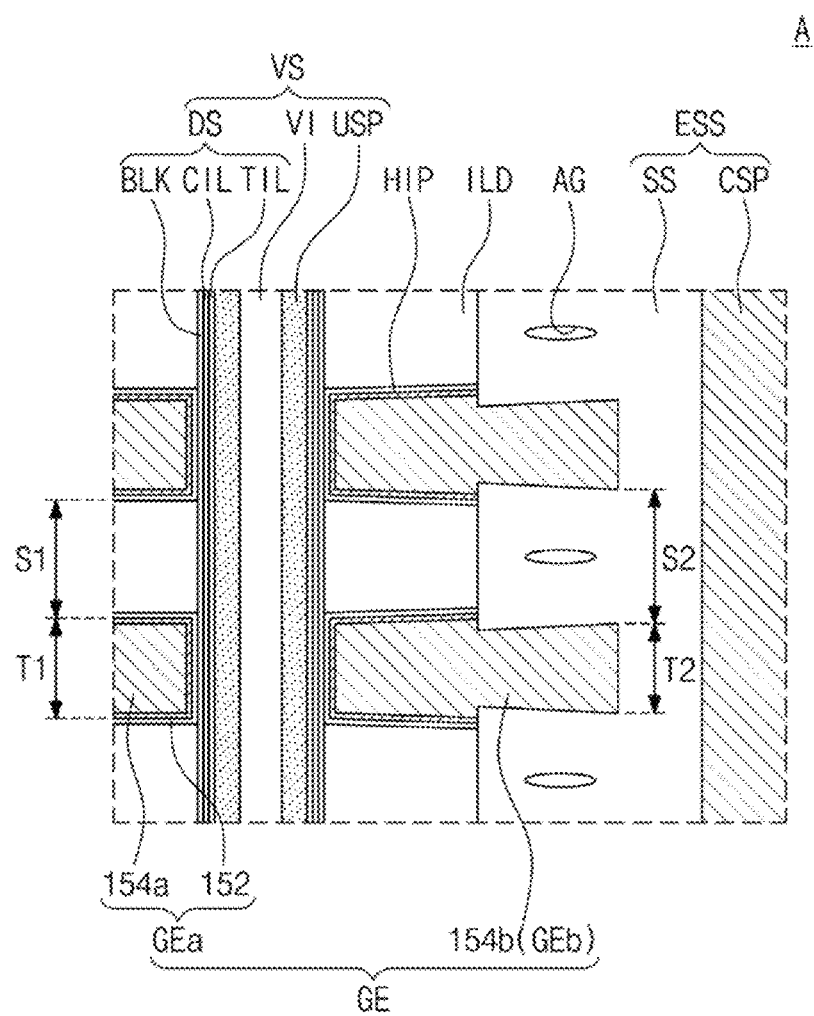

Referring to FIGS. 3A and 3B, the second portion 154b of the metal pattern 154a and 154b may have a minimum thickness at an area adjacent to the sidewalls of the insulating layers ILD. The second portion 154b of the metal pattern 154a and 154b may have a thickness that gradually becomes smaller or larger toward the common source plug CSP. For example, the second portion 154b of the metal pattern 154a and 154b, or the outer portions GEb of the gate electrodes GE, may have sloped top and bottom surfaces. Alternatively, the thickness of the second portion 154b of the metal pattern 154a and 154b may be substantially uniform as shown in FIGS. 3C and 3D.

Referring to FIGS. 3A to 3D, the insulating spacer SS may fill the recess region between neighboring gate electrodes GE and may directly contact top and bottom surfaces of the second portion 154b of the metal pattern 154a and 154b.

Figure 3C:
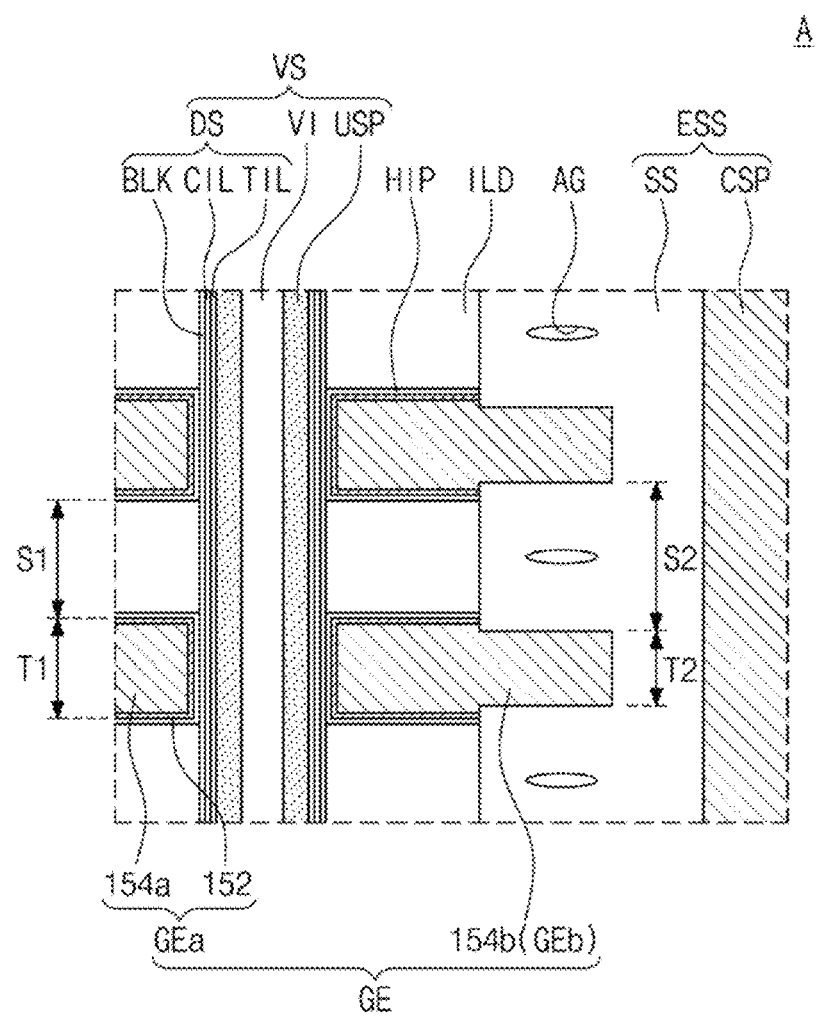
Figure 3D:
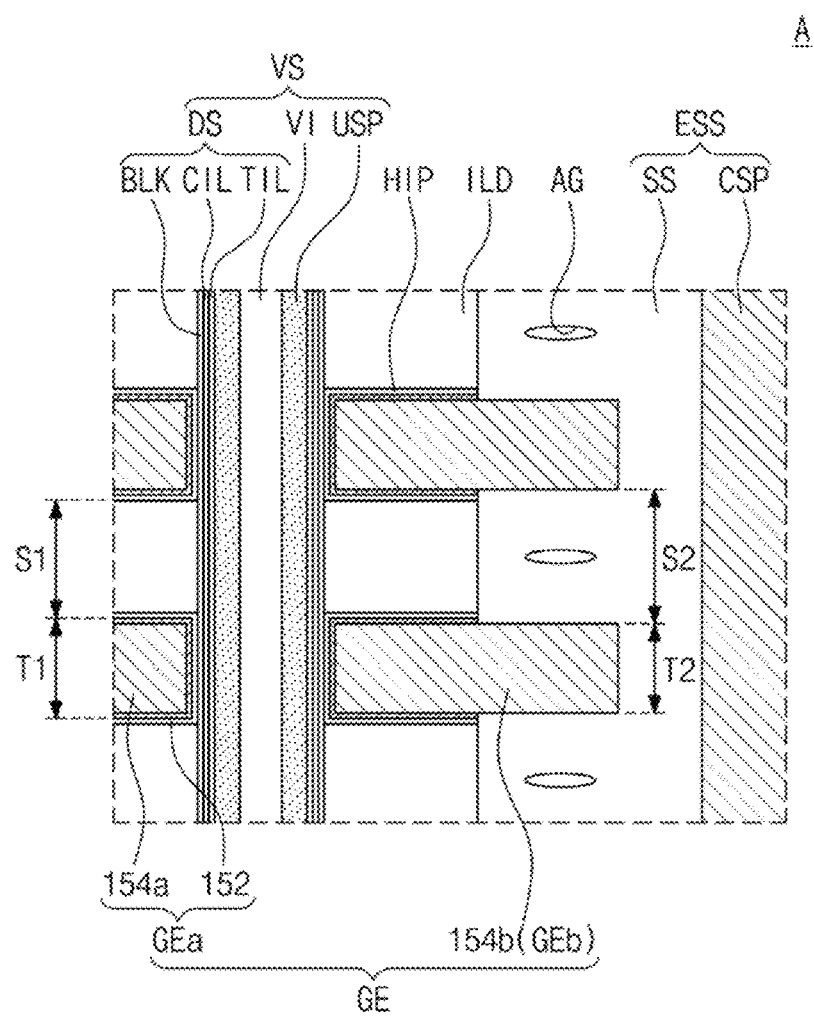

Referring to FIGS. 3B to 3D, the insulating spacer SS may include one or more air gaps AG defined between the outer portions GEb of the gate electrodes GE adjacent to each other.

Figure 3E:
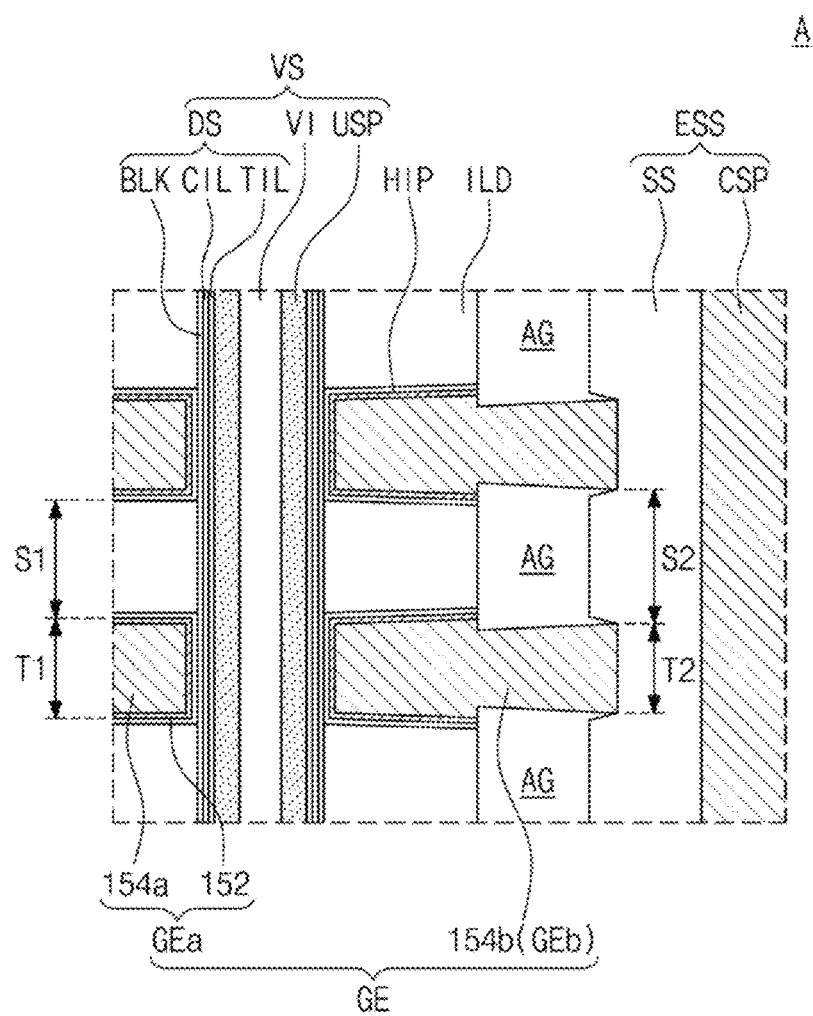
Figure 3F:
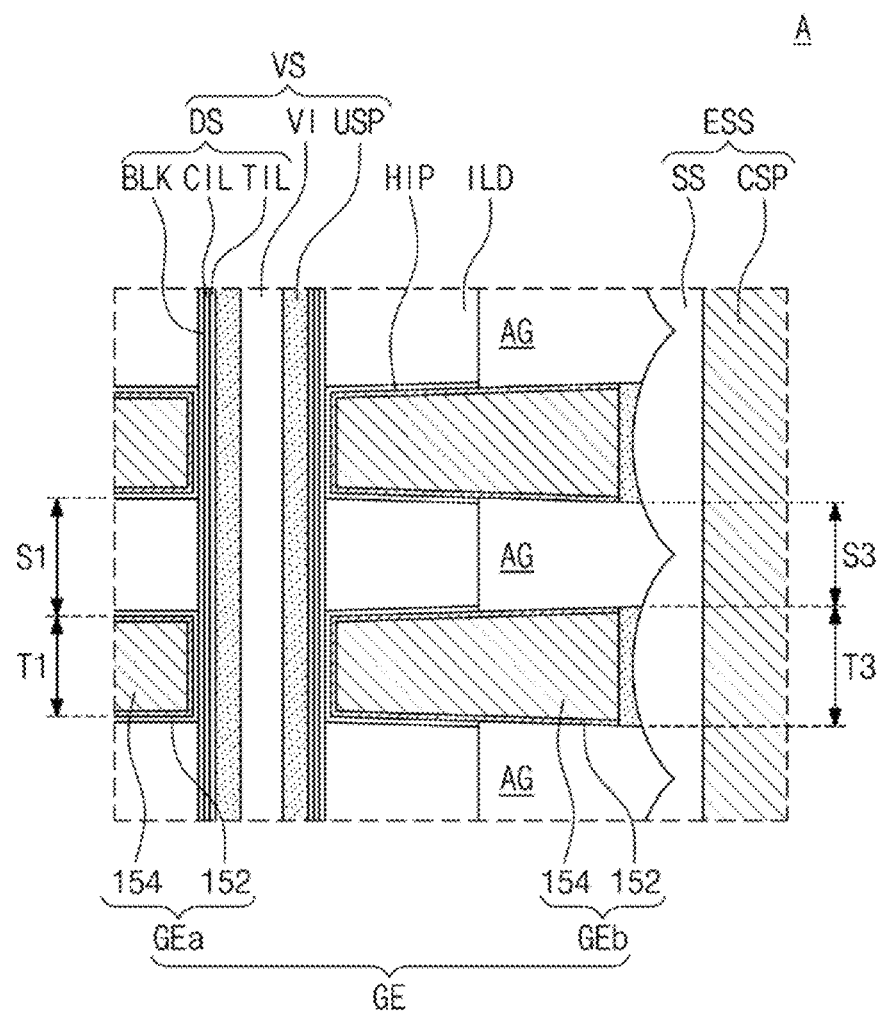
Figure 3G:
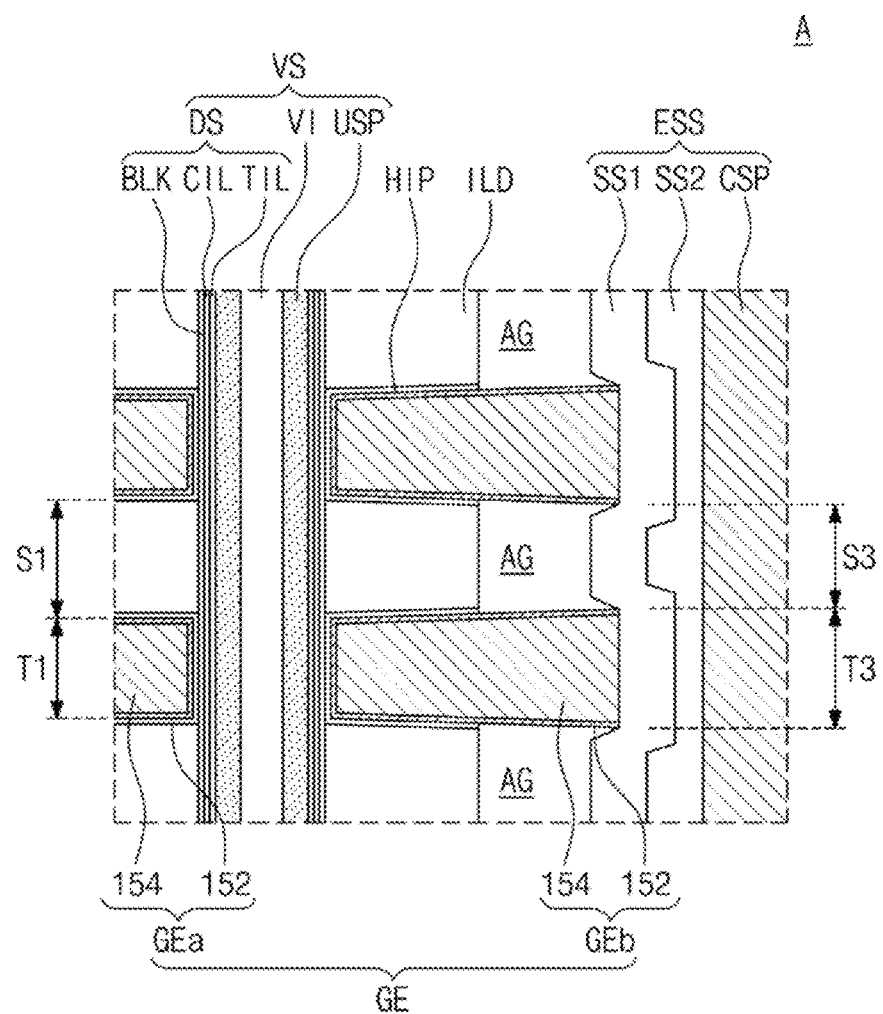
Figure 3H:
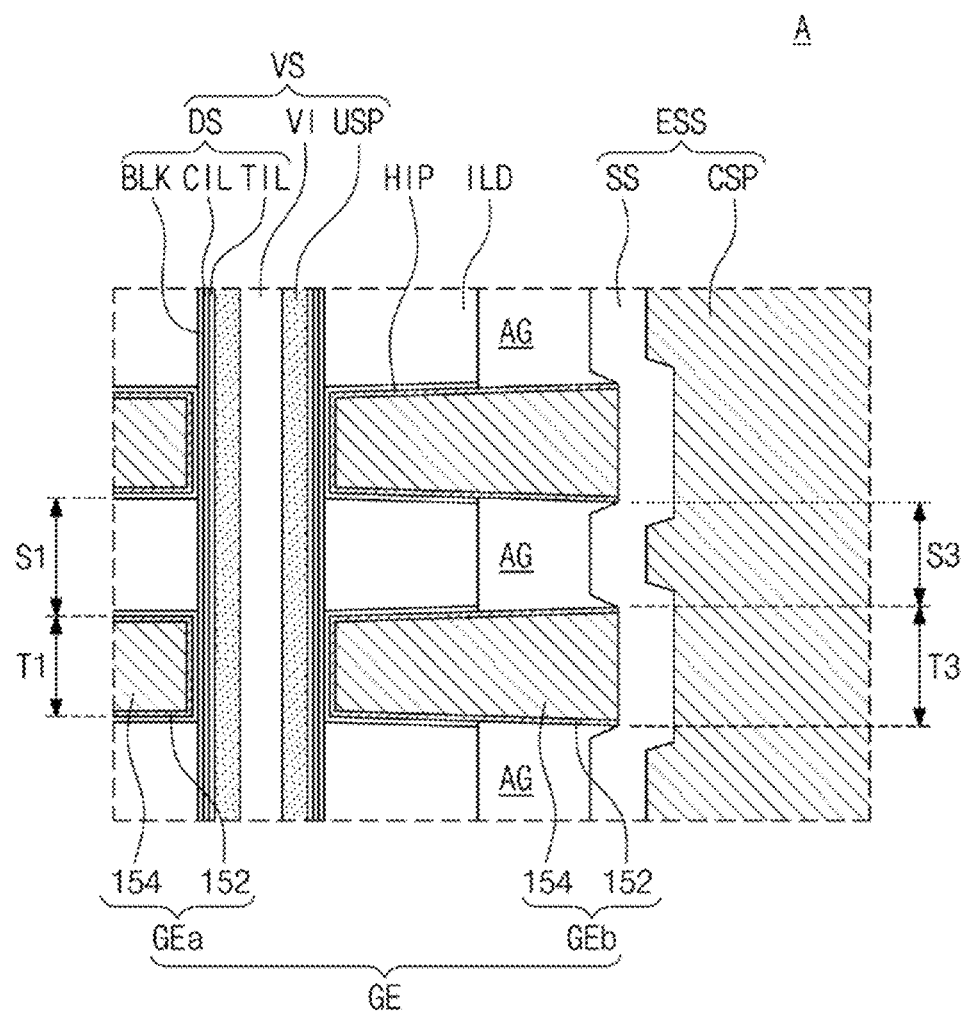

Referring to FIGS. 3F to 3H, the inner portion GEa of the gate electrode GE may have a first thickness T1, and the outer portion GEb of the gate electrode GE may have a third thickness T3 equal to or greater than the first thickness T1. The gate electrodes GE may be spaced apart at an interval that is smaller between the outer portions GEb than between the inner portions GEa (S1>S3). For example, a distance (S3) between the outer portions GEb of the gate electrodes GE vertically adjacent to each other may be smaller than a distance (S1) between the inner portions GEa of the gate electrodes GE vertically adjacent to each other. As discussed above, each of the gate electrodes GE may include the metal pattern 154 and the barrier metal pattern 152, and as shown in FIGS. 3F to 3H, the metal pattern 154 and the barrier metal pattern 152 may horizontally protrude from the sidewalls of the insulating layers ILD. The barrier metal pattern 152 and the metal pattern 154 may have sidewalls that align with each other.

Referring to FIGS. 3E to 3H, the insulating spacer SS may cover the sidewalls of the gate electrodes GE and may be spaced apart from the sidewalls of the insulating layers ILD of the electrode structure ST. The air gaps AG may be defined by the insulating spacer SS, the sidewalls of the insulating layers ILD, and the outer portions GEb of the gate electrodes GE vertically adjacent to each other. For example, a dielectric constant may be smaller between the outer portions GEb of the gate electrodes GE than between the inner portions GEa of the gate electrodes GE. For example, since areas between the outer portions GEb of the gate electrodes GE vertically adjacent to each other may be filled with air gaps AG and air has low dielectric constant, a significant reduction in the dielectric constant of these areas between the outer portions GEb of the gate electrodes GE may occur. The insulating spacer SS may have a non-uniform thickness and may cover the sidewall of the electrode structure ST. As shown in FIGS. 3E to 3G, the insulating spacer SS may include a first sidewall in contact with the sidewall of the electrode structure ST and a second sidewall in contact with the common source plug CSP. The first sidewall may be non-flat, and the second sidewall may be substantially flat. Alternatively, as shown in FIG. 3H, the first and second sidewalls of the insulating spacer SS may be non-flat. In the exemplary embodiment shown in FIG. 3F, the insulating spacer SS may include a thermal oxide layer, and a semiconductor material may partially remain between the insulating spacer SS and the sidewall of the gate electrode GE. In the exemplary embodiment shown in FIG. 3G, the electrode separation structure ESS may include first and second insulating spacers SS1 and SS2, in which the first insulating spacer SS1 and the second insulating spacer SS2 may include different insulating materials.

In the exemplary embodiments shown in FIGS. 3F to 3H, although an interval is smaller between the outer portions GEb of the gate electrodes GE than between the inner portions GEa of the gate electrodes GE, because the air gaps AG are present between the outer portions GEb of the gate electrodes GE, an effective distance may be securely obtained between the outer portions GEb of the gate electrodes GE. Thus, an increase in capacitive coupling between the outer portions GEb of the gate electrodes GE may be prevented. Accordingly, preventing reduction of breakdown voltage of the insulators, which are mainly air gaps AG, between the outer portions GEb of the gate electrodes GE may be achieved. As a result, a three-dimensional semiconductor memory device according to an exemplary embodiment of the present inventive concept with enhanced reliability and electrical characteristics may be obtained.

Figure 4:
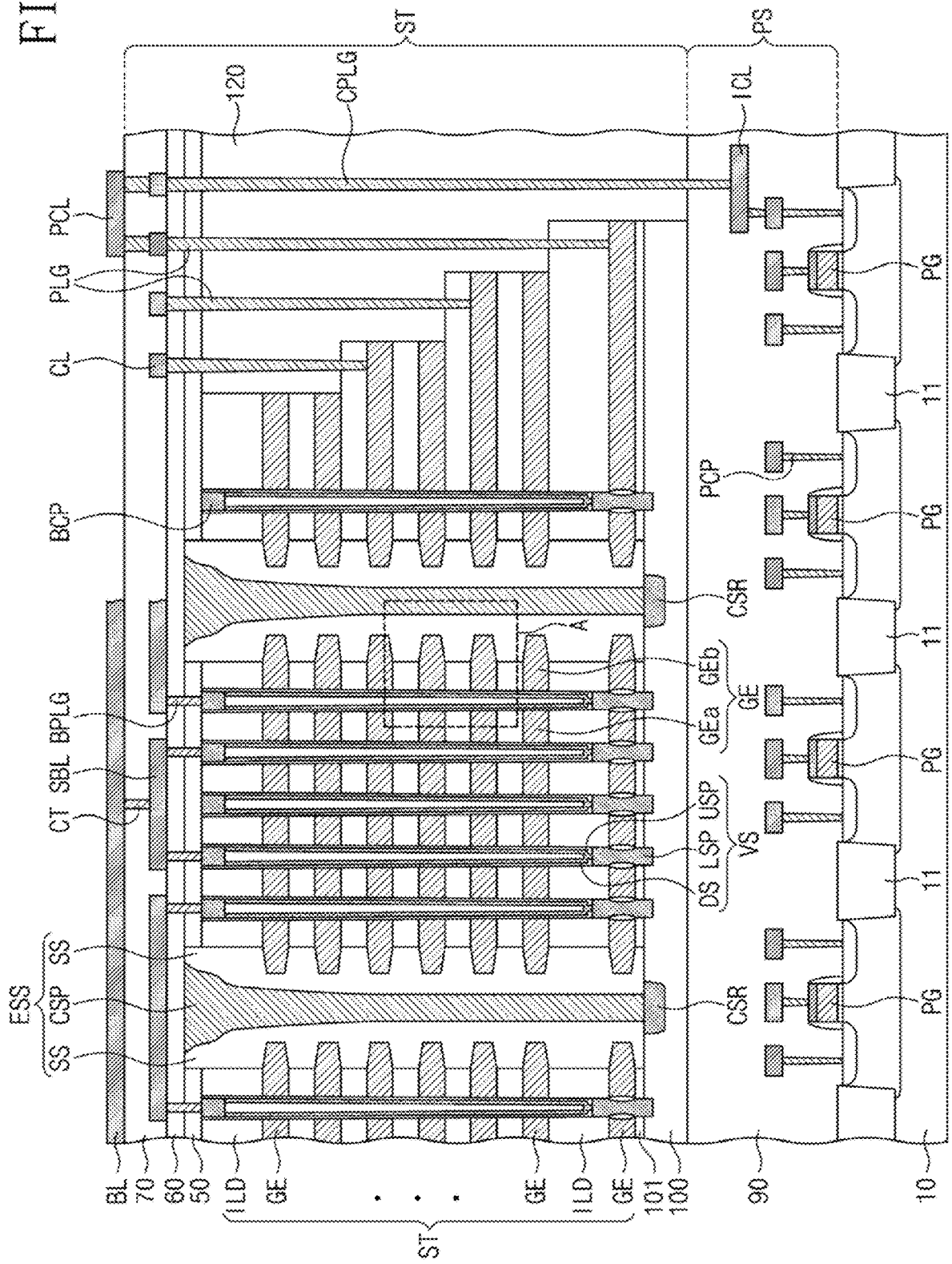
FIGS. 4 and 5 are cross-sectional views showing a three-dimensional semiconductor memory device according to an exemplary embodiment of the present inventive concept.
Figure 5:
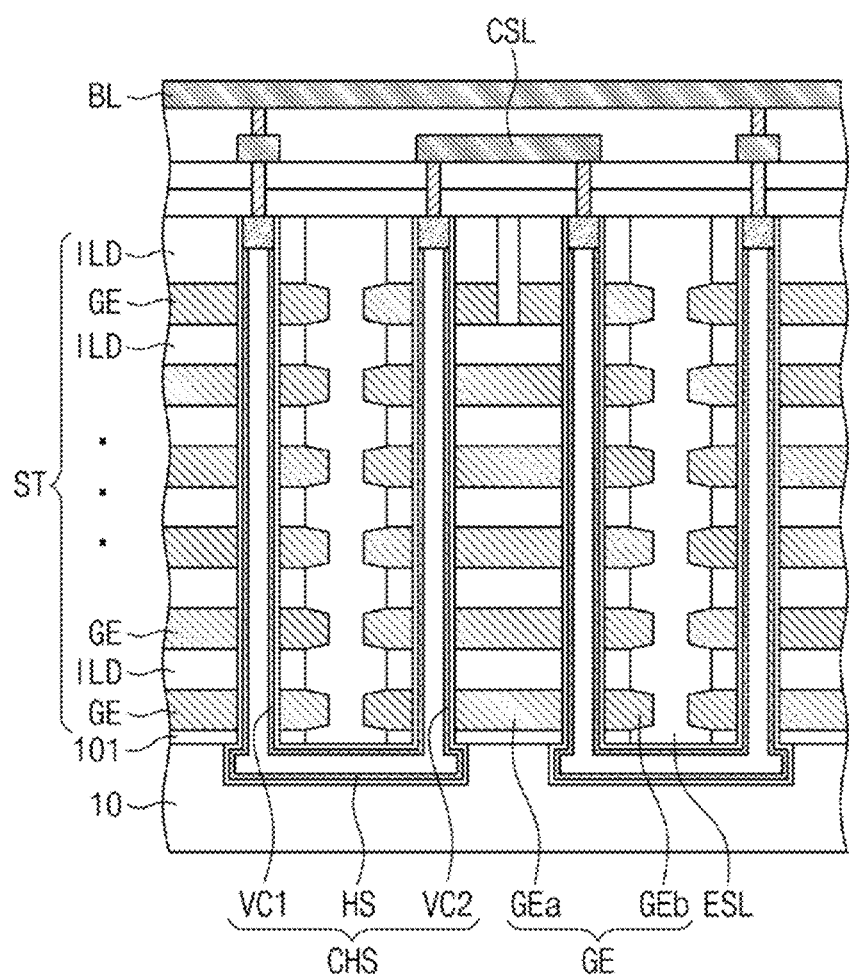

FIGS. 4 and 5 are cross-sectional views showing a three-dimensional semiconductor memory device according to an exemplary embodiment of the present inventive concept. For brevity of description, the following discussion may omit the technical features the same as those of the three-dimensional semiconductor memory device discussed above.

Referring to FIG. 4, a peripheral logic structure PS and a cell array structure CS may be sequentially stacked on a substrate 10. For example, when viewed in plan, the peripheral logic structure PS and the cell array structure CS may overlap each other.

The substrate 10 may include a material having semiconductor characteristics and may be, for example, a bulk silicon substrate. Alternatively, the substrate 10 may be a silicon on insulator (SOI) substrate. The substrate 10 may be provided therein with a device isolation layer 11 defining active regions.

The peripheral logic structure PS may include row and column decoders, a page buffer, and control circuits, in which these components are integrated on the substrate 10. For example, the peripheral logic structure PS may include NMOS and PMOS transistors electrically connected to the cell array structure CS, a resistor, and a capacitor.

The peripheral logic structure PS may include peripheral gate electrodes PG, source and drain impurity regions in the active regions on opposite sides of each of the peripheral gate electrodes PG, peripheral contact plugs PCP, peripheral circuit lines ICL, and a lower buried insulating layer 90.

The peripheral circuit lines ICL may be electrically connected through the peripheral contact plugs PCP to peripheral circuits. For example, the peripheral contact plugs PCP and the peripheral circuit lines ICL may be coupled to NMOS and PMOS transistors.

The lower buried insulating layer 90 may cover the peripheral circuits, the peripheral contact plugs PCP, and the peripheral circuit lines ICL. The lower buried insulating layer 90 may include a plurality of stacked insulating layers.

The cell array structure CS may be disposed on the lower buried insulating layer 90. The cell array structure CS may include components substantially the same as those of the three-dimensional semiconductor memory device discussed with reference to FIGS. 1, 2, and 3A to 3H. Technical features the same as those of the three-dimensional semiconductor memory device discussed above may be omitted for brevity of description.

The cell array structure CS may include a horizontal semiconductor layer 100, electrode structures ST, vertical structures VS, electrode separation structures ESS, and bit lines BL. The horizontal semiconductor layer 100 may include a semiconductor material, such as, for example, silicon (Si), germanium (Ge), silicon germanium (SiGe), gallium arsenide (GaAs), indium gallium arsenide (InGaAs), aluminum gallium arsenide (AlGaAs), or a mixture thereof. The horizontal semiconductor layer 100 may have at least one selected from a single crystalline structure, an amorphous structure, and a polycrystalline structure.

The electrode structures ST may have, on their portions, stepwise structures for electrical connections between gate electrodes GE and the peripheral logic structure PS. The horizontal semiconductor layer 100 may be provided thereon with an upper buried insulating layer 120 covering ends of the electrode structures ST. The electrode structures ST may be provided on their ends with a wiring structure that electrically connects the cell array structure CS to the peripheral logic structure PS. The wiring structure may include contact plugs PLG that penetrate the upper buried insulating layer 120 and contact ends of the gate electrodes GE, and may also include connection lines CL and PCL that are on the upper buried insulating layer 120 and are coupled to the contact plugs PLG. For example, the contact plugs PLG may penetrate the upper buried insulating layer 120 and the first and second interlayer dielectric layers 50 and 60 to couple with corresponding ends of the gate electrodes GE.

One or more connection plugs CPLG may electrically connect the cell array structure CS to the peripheral logic structure PS. The connection plugs CPLG may be coupled to the peripheral circuit lines ICL, while penetrating the upper buried insulating layer 120 and the horizontal semiconductor layer 100. For example, the connection plugs CPLG may penetrate the first and second interlayer dielectric layers 50 and 60, and the upper buried insulating layer 120 to couple with the peripheral circuit lines ICL and to electrically connect with source/drain regions on one side of peripheral gate electrodes PG.

Referring to FIG. 5, electrode structures ST may be disposed on a substrate 10 and spaced apart from each other by an electrode separation layer ESL including an insulating material. The electrode structures ST may have technical features the same as those of the three-dimensional semiconductor memory device discussed above, and a description thereof may be omitted.

Channel structures CHS may penetrate the electrode structures ST. Each of the channel structures CHS may include first and second vertical channels VC1 and VC2 that correspondingly penetrate the electrode structures ST adjacent to each other, and may also include a horizontal channel HS through which the first and second vertical channels VC1 and VC2 are connected to each other below the electrode structures ST. The first and second vertical channels VC1 and VC2 may be provided in vertical holes that penetrate the electrode structures ST. The horizontal channel HS may be provided in a recessed region formed in the substrate 10. In an exemplary embodiment of the present inventive concept, the horizontal channel HS may have a hollow pipe or macaroni shape successively connected to the first and second vertical channels VC1 and VC2. For example, the horizontal channel HS and the first and second vertical channels VC1 and VC2 may have a unitary pipe shape. The horizontal channel HS and the first and second vertical channels VC1 and VC2 may be formed of one semiconductor layer continuously extending without boundaries.

In an exemplary embodiment of the present inventive concept, each of the channel structures CHS may be configured such that the first vertical channel VC1 may be connected to a bit line BL and the second vertical channel VC2 may be connected to a common source line CSL. Each of the channel structures CHS may be used as channels of memory cell transistors and of ground and string select transistors, in which transistors constitute one cell string.

FIGS. 6A to 13A are cross-sectional views taken along line I-I' of FIG. 1, showing a method of fabricating a three-dimensional semiconductor memory device according to an exemplary embodiment of the present inventive concept. FIGS. 6B to 13B are cross-sectional views of section A of FIGS. 6A to 13A, respectively, showing a method of fabricating a three-dimensional semiconductor memory device according to an exemplary embodiment of the present inventive concept.

Figure 6B:
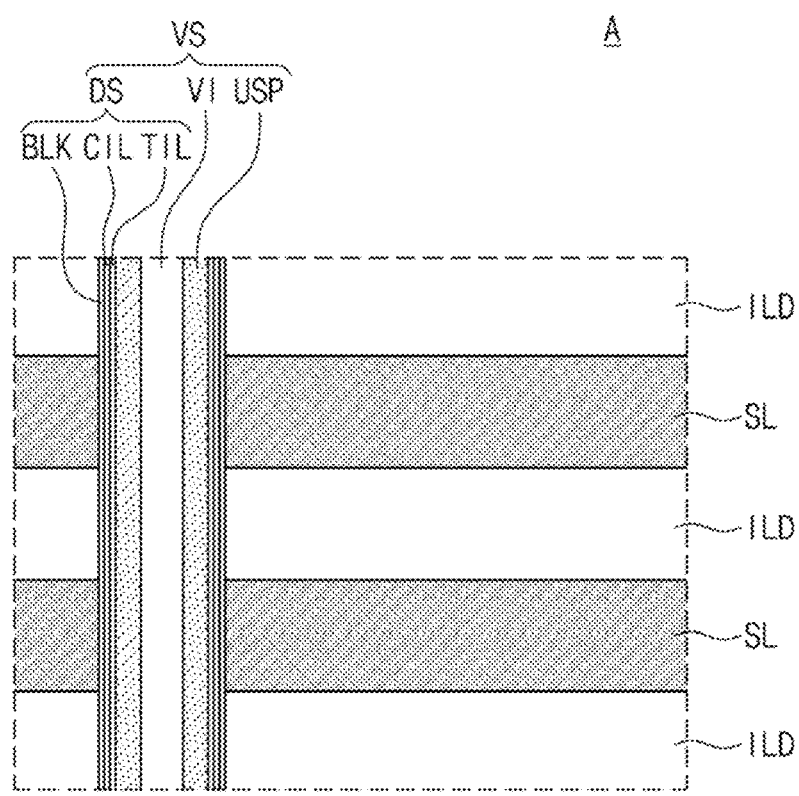

Referring to FIGS. 1, 6A, and 6B, sacrificial layers SL and insulating layers ILD may be alternately deposited to form a thin-layer structure 110 on a substrate 10. The thin-layer structure 110 may be formed in such a way that the sacrificial layers SL may be formed of a material that can be etched with an etch selectivity to the insulating layers ILD. For example, the sacrificial layers SL and the insulating layers ILD may be formed of insulating materials exhibiting different etch selectivities from each other. The sacrificial layers SL and the insulating layers ILD may be formed of one selected from, for example, a silicon (Si) layer, a silicon oxide ($SiO_2$) layer, a silicon carbide (SiC) layer, a silicon germanium (SiGe) layer, a silicon oxynitride (SiON) layer, and a silicon nitride ($Si_3N_4$) layer. For example, the sacrificial layers SL may be formed of a silicon nitride ($Si_3N_4$) layer, and the insulating layers ILD may be formed of a silicon oxide ($SiO_2$) layer. Before the thin-layer structure 110 is formed, a thermal oxide layer may be deposited to form a buffer insulating layer 101 on a top surface of the substrate 10. For example, the buffer insulation layer 101 may be a silicon oxide ($SiO_2$) layer formed, for example, by deposition or thermal oxidation.

Vertical structures VS may be formed to penetrate the thin-layer structure 110, and thus the substrate 10 may be connected to the vertical structures VS. The formation of the vertical structures VS may include forming vertical holes to penetrate the thin-layer structure 110 and the buffer insulating layer 101 and to expose the substrate 10, and then forming in each of the vertical holes a lower semiconductor pattern LSP, an upper semiconductor pattern USP, and a data storage pattern DS. The forming of the vertical holes may include forming a mask pattern on the thin-layer structure 110 and performing an anisotropic etching process on the thin-layer structure 110 using the mask pattern as an etch mask. The data storage pattern DS may include, as shown in FIG. 6B, a tunnel insulating layer TIL, a charge storage layer CIL, and a blocking insulating layer BLK sequentially stacked on a sidewall of the upper semiconductor pattern USP.

The lower semiconductor pattern LSP may be an epitaxial pattern that is formed by a selective epitaxial growth (SEG) process in which the substrate 10 exposed to the vertical holes is used as a seed layer. The lower semiconductor pattern LSP may be formed to have a pillar shape that fills a lower portion of the vertical hole. Alternatively, the formation of the lower semiconductor pattern LSP may be omitted.

The upper semiconductor pattern USP may be formed in the vertical hole in which the lower semiconductor pattern LSP is formed. The lower and upper semiconductor patterns LSP and USP may include a semiconductor material such as, for example, silicon (Si), germanium (Ge), or a mixture thereof. The upper semiconductor pattern USP may be formed by depositing a semiconductor layer having a uniform thickness in the vertical hole. The semiconductor layer may be conformally formed to have a thickness that does not completely fill the vertical hole. Accordingly, the upper semiconductor pattern USP may define an empty space (or gap) in the vertical hole, and the empty space may be filled with a buried insulating pattern VI or air. For example, the upper semiconductor pattern USP may have a macaroni shape, a pipe shape whose bottom end is closed, or a U shape defining the empty space therein. A bit line conductive pad BCP may be formed on a top end of the upper semiconductor pattern USP. The bit line conductive pad BCP may be an impurity-doped region or consist of a conductive material.

Figure 7A:
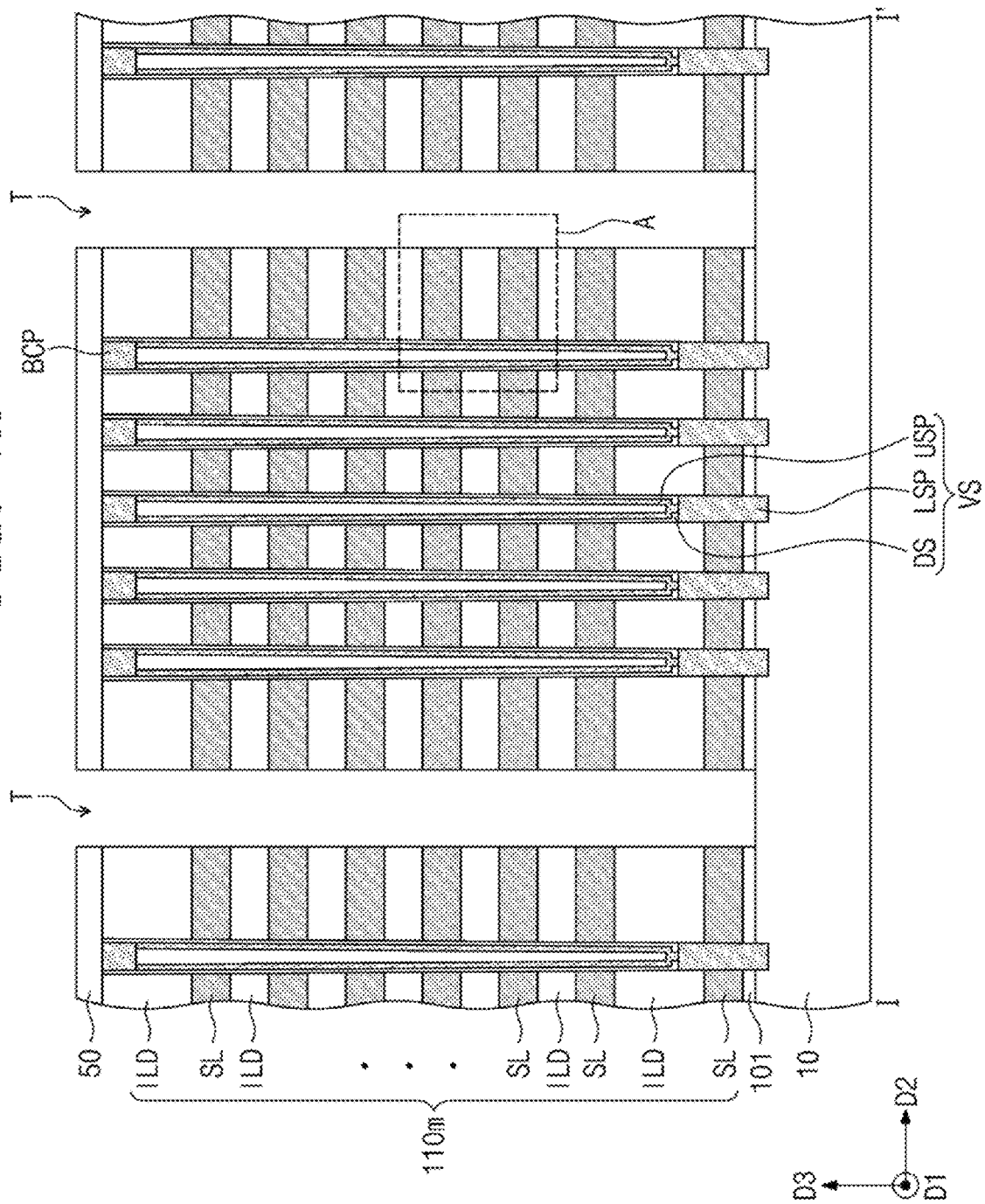
Figure 7B:
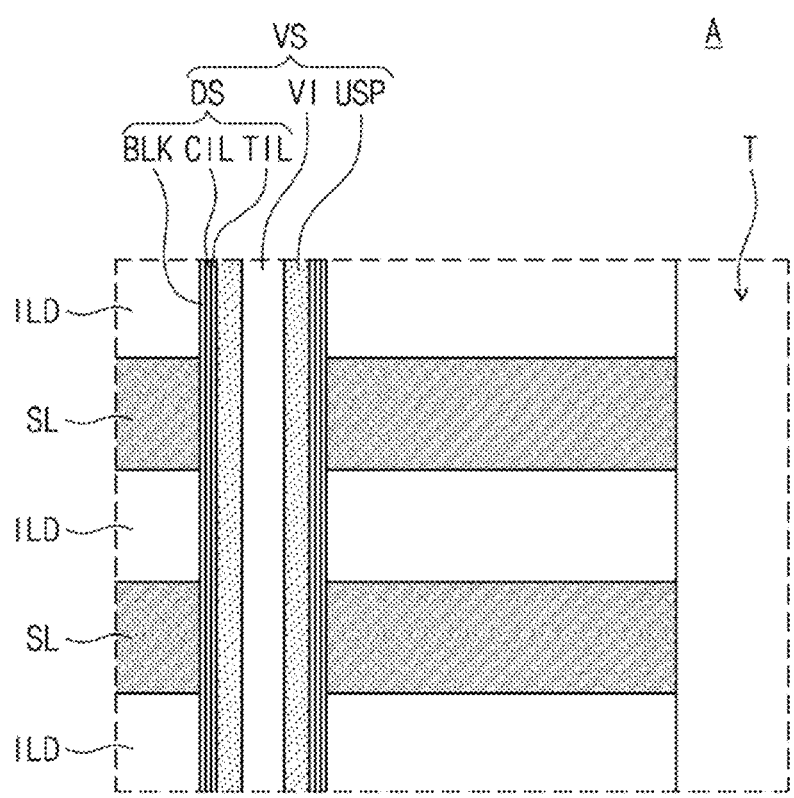

Referring to FIGS. 1, 7A, and 7B, a first interlayer dielectric layer 50 may be formed to cover top surfaces of the vertical structures VS. After the first interlayer dielectric layer 50 is formed, trenches T may be formed to penetrate the first interlayer dielectric layer 50 and the thin-layer structure 110 and to expose the substrate 10. The trenches T may extend in a first direction D1 and may be spaced apart from each other in a second direction D2 perpendicular to the first direction D1. The trenches T may be spaced apart from the vertical structures VS and may expose sidewalls of the sacrificial layers SL and of the insulating layers ILD. A mask pattern defining planar positions of the trenches T may be formed on the first interlayer dielectric layer 50. The trenches T may be formed by performing an anisotropic etching process on the thin-layer structure 110 using the mask pattern as an etch mask, and the insulating layers ILD and the sacrificial layers SL may have high etch selectivities with respect to the mask pattern during the anisotropic etching process.

The trenches T may divide the thin-layer structure 110 into a plurality of mold structures 110m on the substrate 10. The mold structures 110m may have a linear shape extending in the first direction D1 and may be spaced apart from each other in the second direction D2. The trench T may partially expose the substrate 10 between the mold structures 110m, and the vertical structures VS may penetrate corresponding mold structures 110m.

Figure 8A:
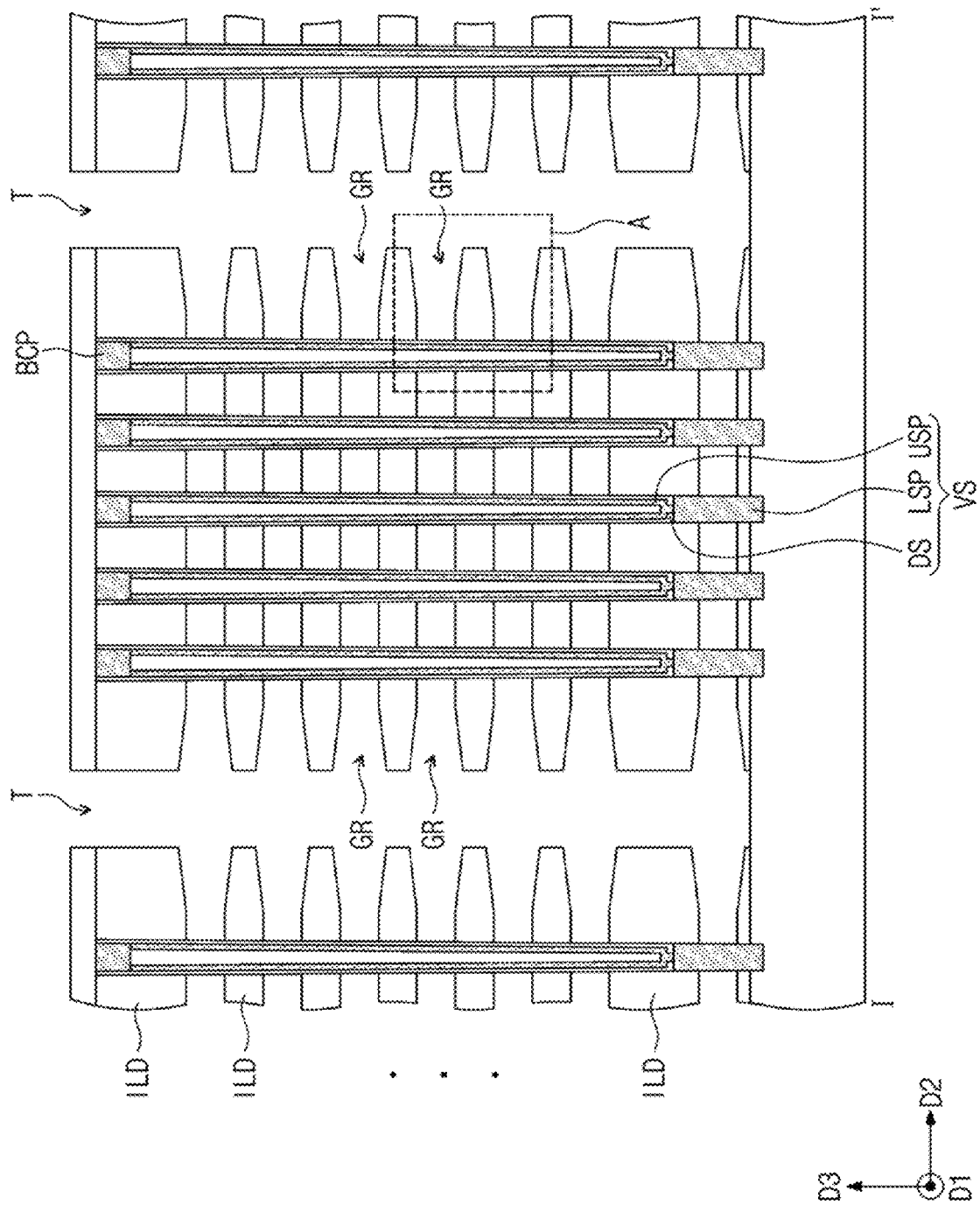
Figure 8B:
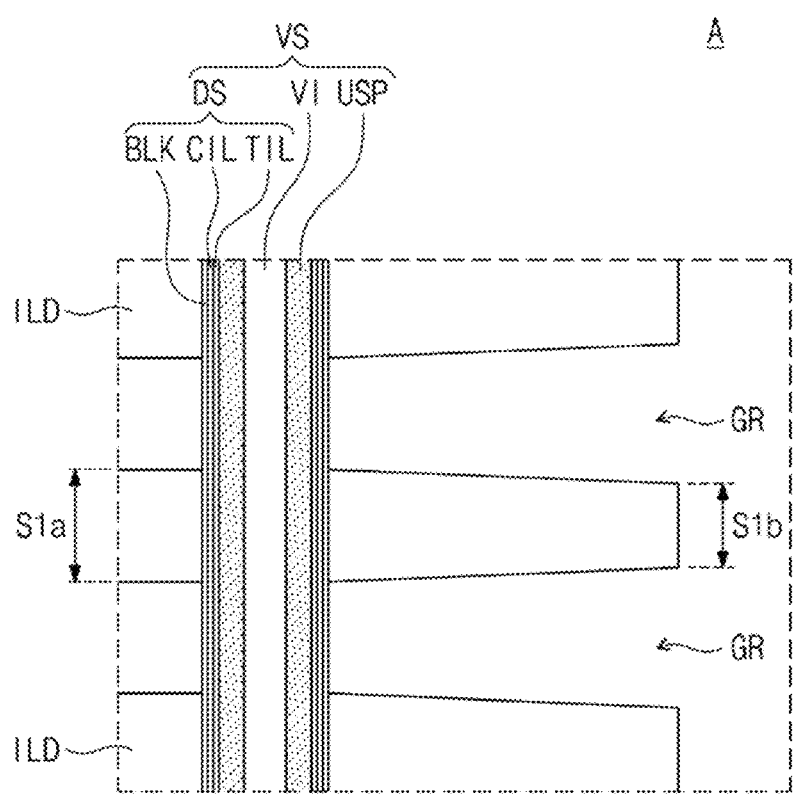

Referring to FIGS. 1, 8A, and 8B, the sacrificial layers SL exposed to the trenches T may be removed to form gate regions GR between the insulating layers ILD. The gate regions GR may be formed after the sacrificial layers SL are isotropically etched using an etch recipe exhibiting an etch selectivity of the sacrificial layers SL to the insulating layers ILD, the vertical structures VS, and the substrate 10. The isotropic etching process may completely remove the sacrificial layers SL. For example, when the sacrificial layers SL are silicon nitride layers and the insulating layers ILD are silicon oxide layers, the isotropic etching process may be performed using an etchant that includes phosphoric acid.

In an exemplary embodiment of the present inventive concept, during the formation of the gate regions GR, the insulating layers ILD may become thicker at their inner portions adjacent to the vertical structures VS than at their outer portions adjacent to the trenches T (S1a>S1b) as shown in FIG. 8B. For example, the formation of the gate regions GR may include performing a first etching process that uses an etchant exhibiting a low etch selectivity of the sacrificial layers SL to the insulating layers ILD and performing a second etching process that uses an etchant exhibiting a high etch selectivity of the sacrificial layers SL to the insulating layers ILD. When the first etching process is performed, the sacrificial layers SL may be removed, and at the same time, portions of the insulating layers ILD may become thinner. For example, the first and second etching processes may be in-situ performed in a single process chamber, and in this case, thicknesses of the insulating layers ILD may gradually become smaller toward the trench T and the gate regions GR may gradually become wider measured in the third direction D3 toward the trench T. For example, when the first and second etching processes are performed, an etch selectivity between the insulating layers ILD and the sacrificial layers SL may be adjusted either by controlling an amount of deionized water added to an etchant including phosphorous acid or by controlling a temperature of the etchant. The gate regions GR may horizontally extend from the trenches T to expose portions of the blocking insulating layer BLK on the sidewall of the upper semiconductor pattern USP, and a lowermost one of the gate regions GR may horizontally extend from the trenches T expose a portion of the lower semiconductor pattern LSP.

Figure 9B:
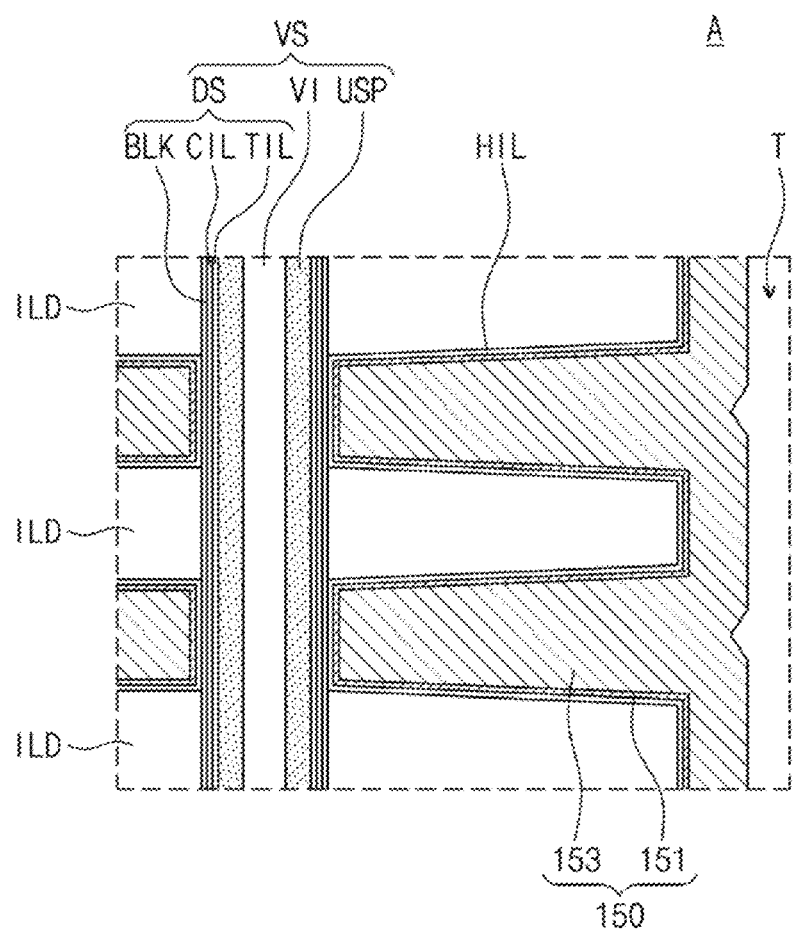

Referring to FIGS. 1, 9A, and 9B, a horizontal insulating layer HIL and a gate conductive layer 150 may be sequentially formed in the gate regions GR. The horizontal insulating layer HIL may be formed to have a substantially uniform thickness on a surface of the mold structure 110*m* in which the gate regions CR are formed. The gate conductive layer 150 may partially or completely fill the trenches T. Before the horizontal insulating layer HIL is formed, thermal oxide layers may be formed on sidewalls of the lower semiconductor pattern LSP exposed to the gate regions GR.

The gate conductive layer 150 may be deposited by providing the gate regions GR with a deposition gas through the trenches T. Intervals between the insulating layers ILD may become smaller toward the trenches T, and thus creation of voids may be suppressed when the gate regions GR are filled with the gate conductive layer 150.

The formation of the gate conductive layer 150 may include sequentially depositing a barrier metal layer 151 and a metal layer 153 in the gate regions and the trench. The barrier metal layer 151 may include metal nitride, such as, for example, TiN, TaN, or WN. The metal layer 153 may include metal, such as, for example, W, Al, Ti, Ta, Co, or Cu. For example, the gate conductive layer 150 may be formed by performing a chemical vapor deposition (CVD) process that uses tungsten hexafluoride gas ($WF_6$) and one of silane gas ($SiH_4$) and hydrogen gas ($H_2$).

Figure 10A:
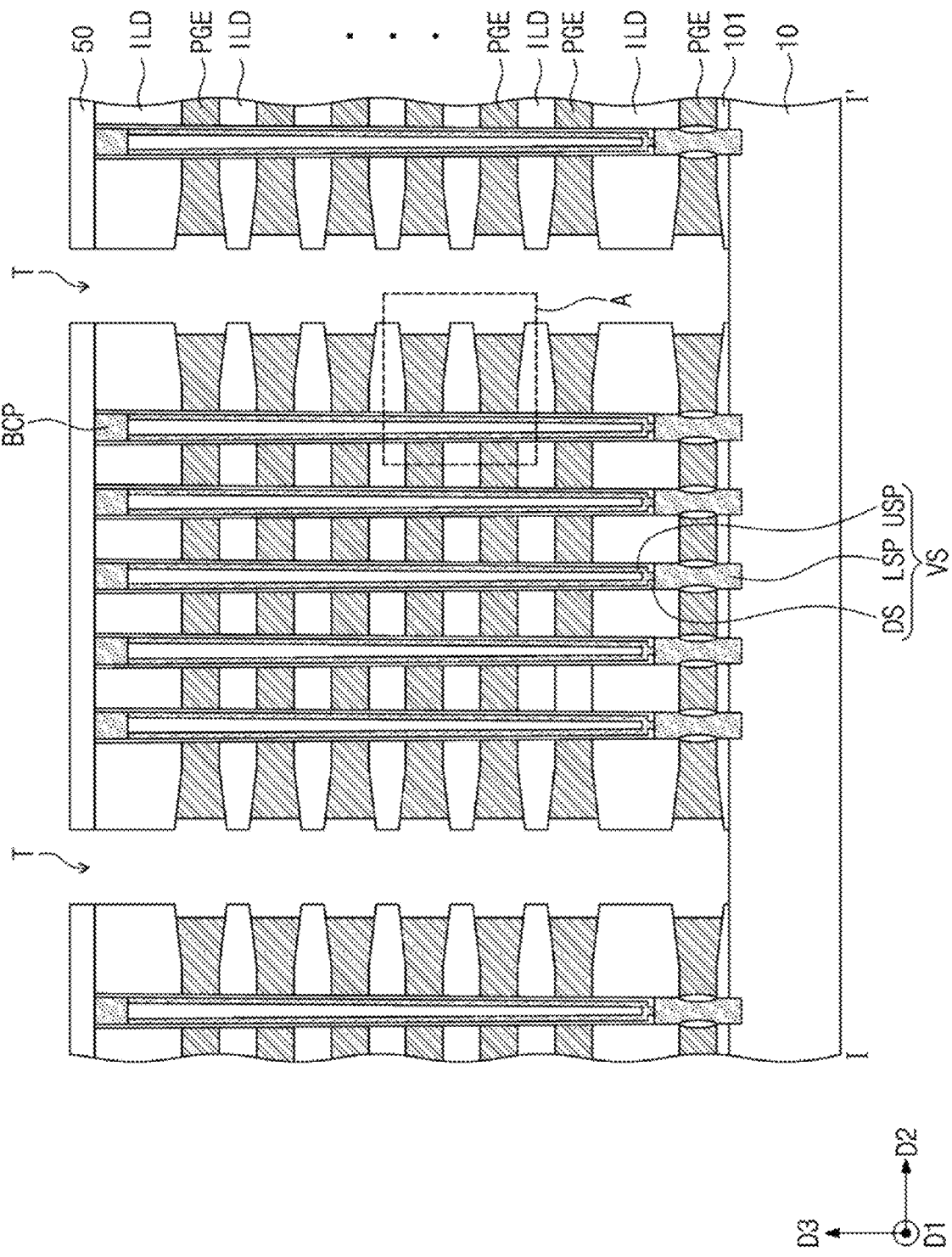
Figure 10B:
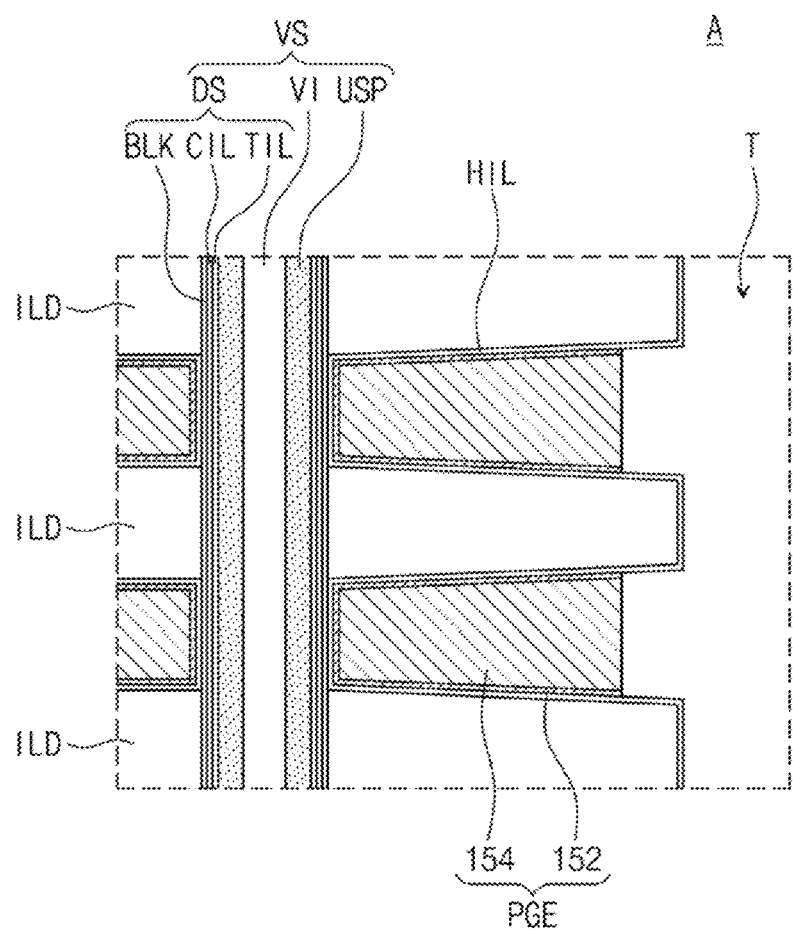

Referring to FIGS. 1, 10A, and 10B, the gate conductive layer 150 in the trenches T may be partially removed to form preliminary gate electrodes PGE in corresponding gate regions GR.

The preliminary gate electrodes PGE may be formed by anisotropically or isotropically etching the gate conductive layer 150 deposited in the trenches T. When the gate conductive layer 150 is etched, the horizontal insulating layer HIL may serve as an etch stop layer, and the formation of the preliminary gate electrodes PGE may cause the trenches T to expose the horizontal insulating layer HIL deposited on the sidewalls of the insulating layers ILD. The preliminary gate electrodes PGE may have sidewalls that are more recessed than the sidewalls of the insulating layers ILD. For example, the insulating layers ILD may horizontally protrude from sidewalls of the preliminary gate electrodes PGE. Each of the preliminary gate electrodes PGE may include a barrier metal pattern 152 and a metal pattern 154. The preliminary gate electrodes PGE may be thicker at their outer portions adjacent to the trenches T than at their inner portions adjacent to the vertical structures VS.

Figure 11A:
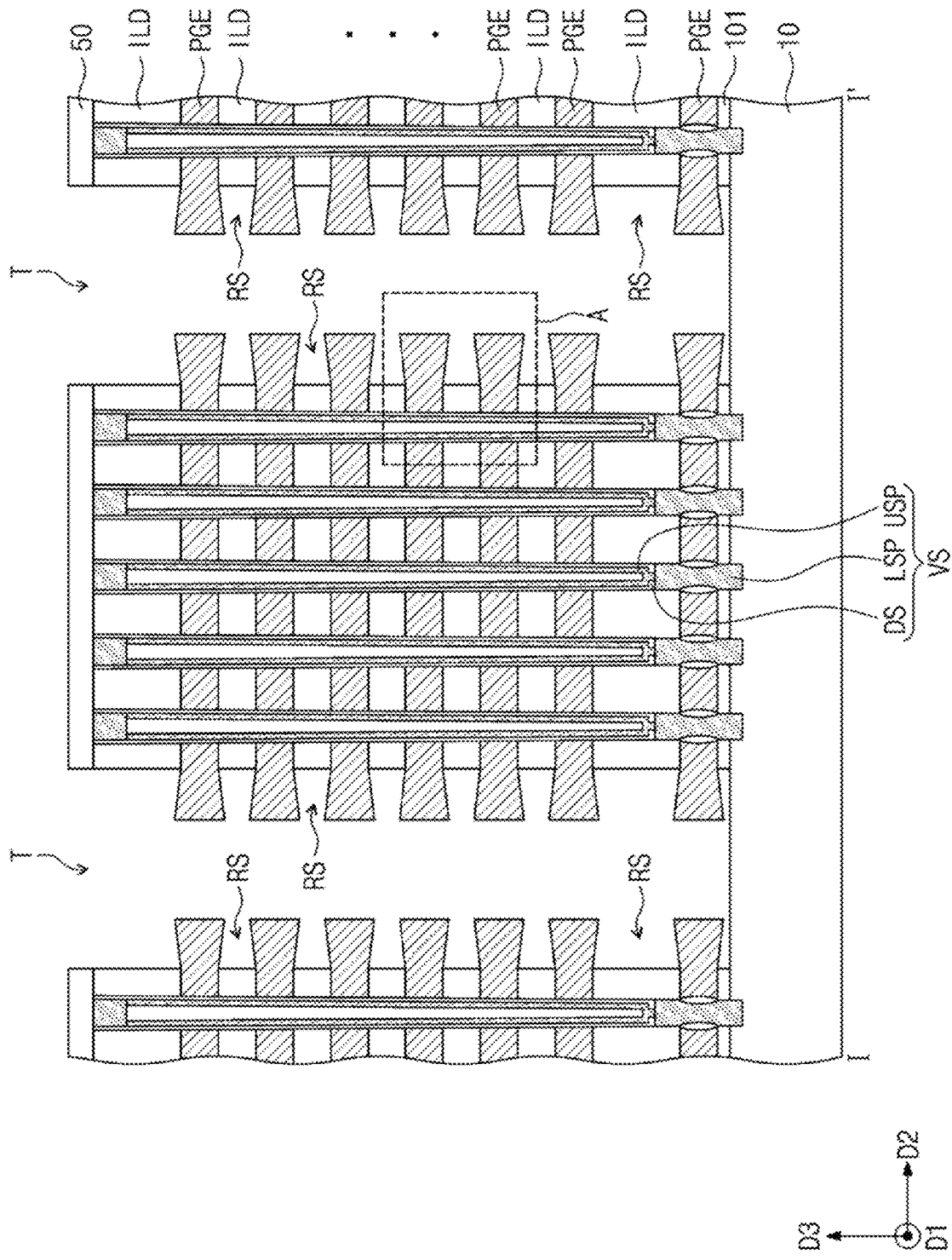
Figure 11B:
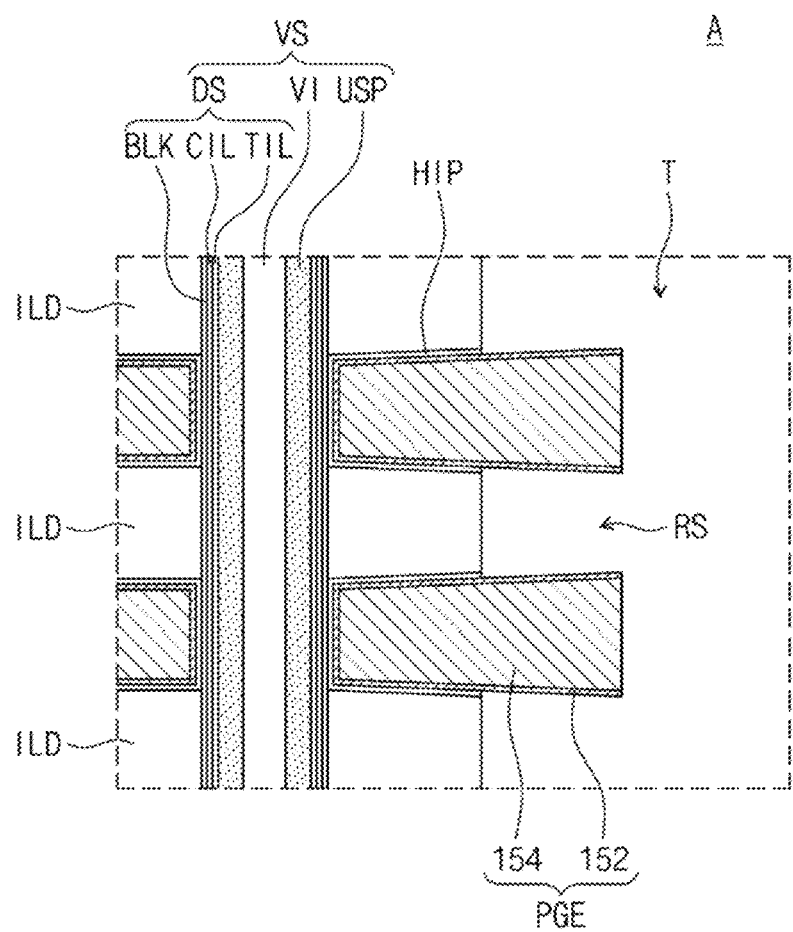

Referring to FIGS. 1, 11A, and 11B, after the preliminary gate electrodes PGE are formed, the sidewalls of insulating layers ILD exposed to the trenches T may be recessed. Accordingly, recess regions RS may be formed between the preliminary gate electrodes PGE vertically adjacent to each other. The preliminary gate electrodes PGE may be partially exposed by the recess regions.

The formation of the recess regions RS may include sequentially isotropically etching the horizontal insulating layer HIL and the insulating layers ILD, in which layers HIL and ILD being etched are exposed to the trenches T. The formation of the recess regions RS may form horizontal insulating patterns HIP in corresponding gate regions GR and may partially expose the barrier metal patterns 152 of the preliminary gate electrodes PGE.

Figure 12A:
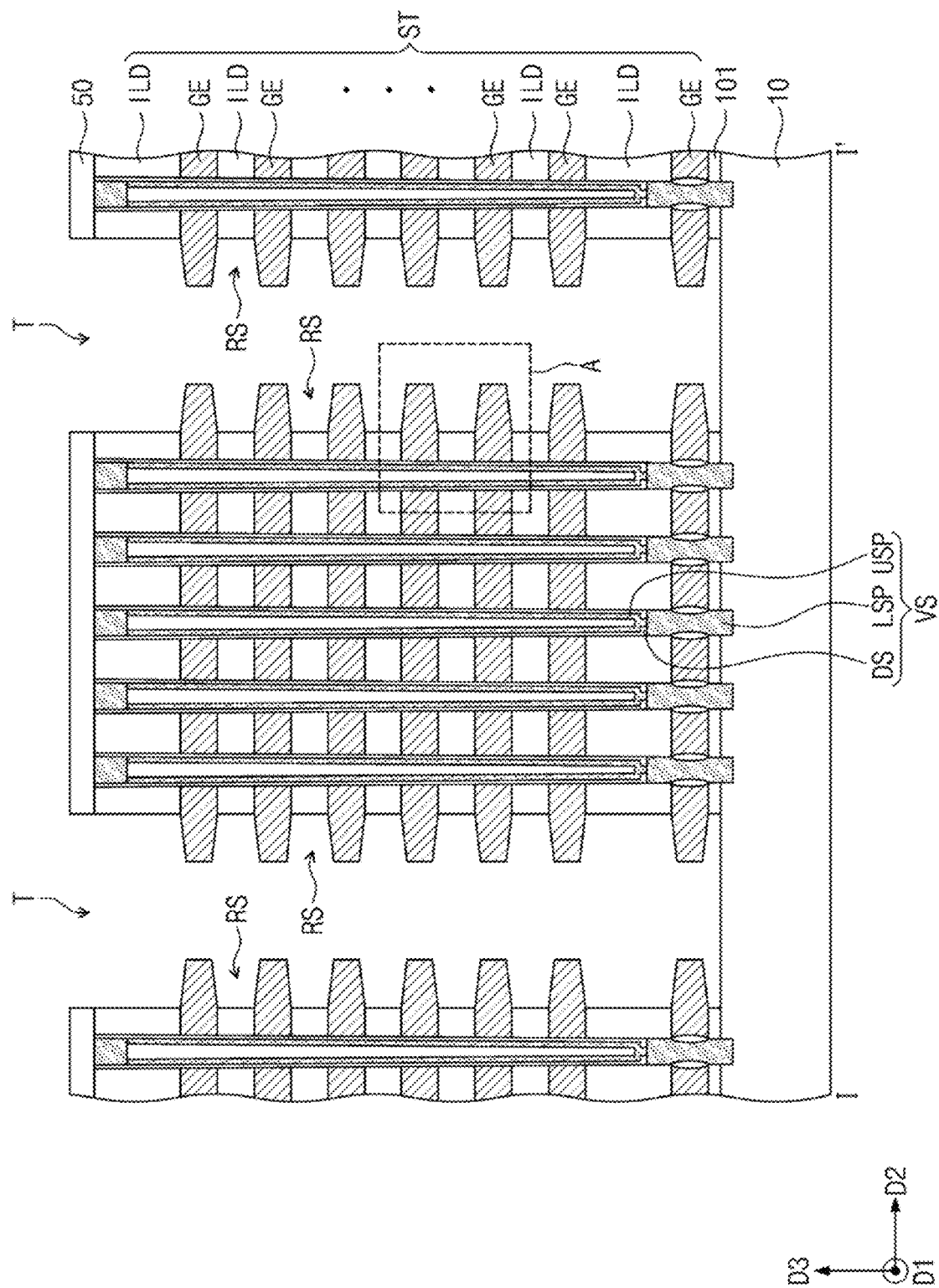
Figure 12B:
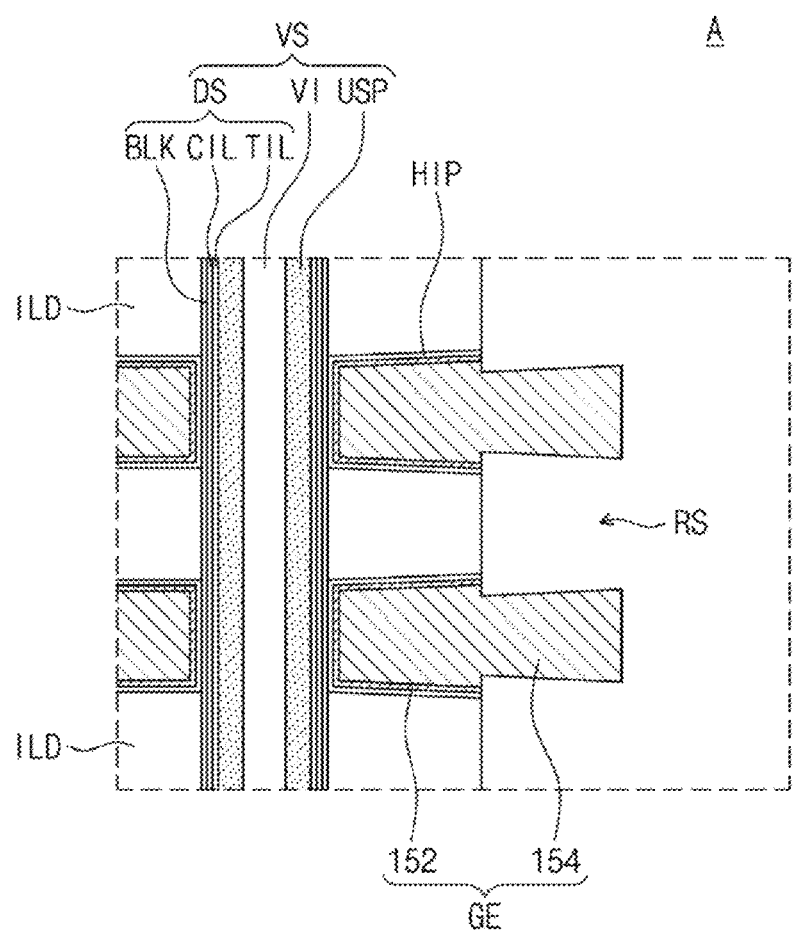

Referring to FIGS. 1, 12A, and 12B, a trimming process may be performed on the preliminary gate electrodes PGE exposed to the recess regions RS. The trimming process may include performing an isotropic etching process on portions of the preliminary gate electrodes PGE exposed to the trenches T and the recess regions RS. When the isotropic etching process is performed on the portions of the preliminary gate electrodes PGE, the barrier metal pattern 152 and the metal pattern 154 may be sequentially partially etched. The barrier metal pattern 152 may thus be partially etched to expose the metal pattern 154, and as a result, the metal pattern 154 exposed to the recess region RS may also be partially etched and may become thinner. For example, the gate electrodes GE (the outer portions GEb, see FIG. 3A) exposed to the recess regions RS may have a thickness smaller than a thickness of the gate electrodes GE (the inner portions GEa, see FIG. 3A) not exposed to the recess regions RS. The trimming process may result in forming electrode structures ST each including gate electrodes GE and the insulating layers ILD that are vertically and alternately stacked on the substrate 10. The electrode structures ST may have, on their sidewalls, the recess regions RS between the gate electrodes GE adjacent to each other.

Figure 13A:
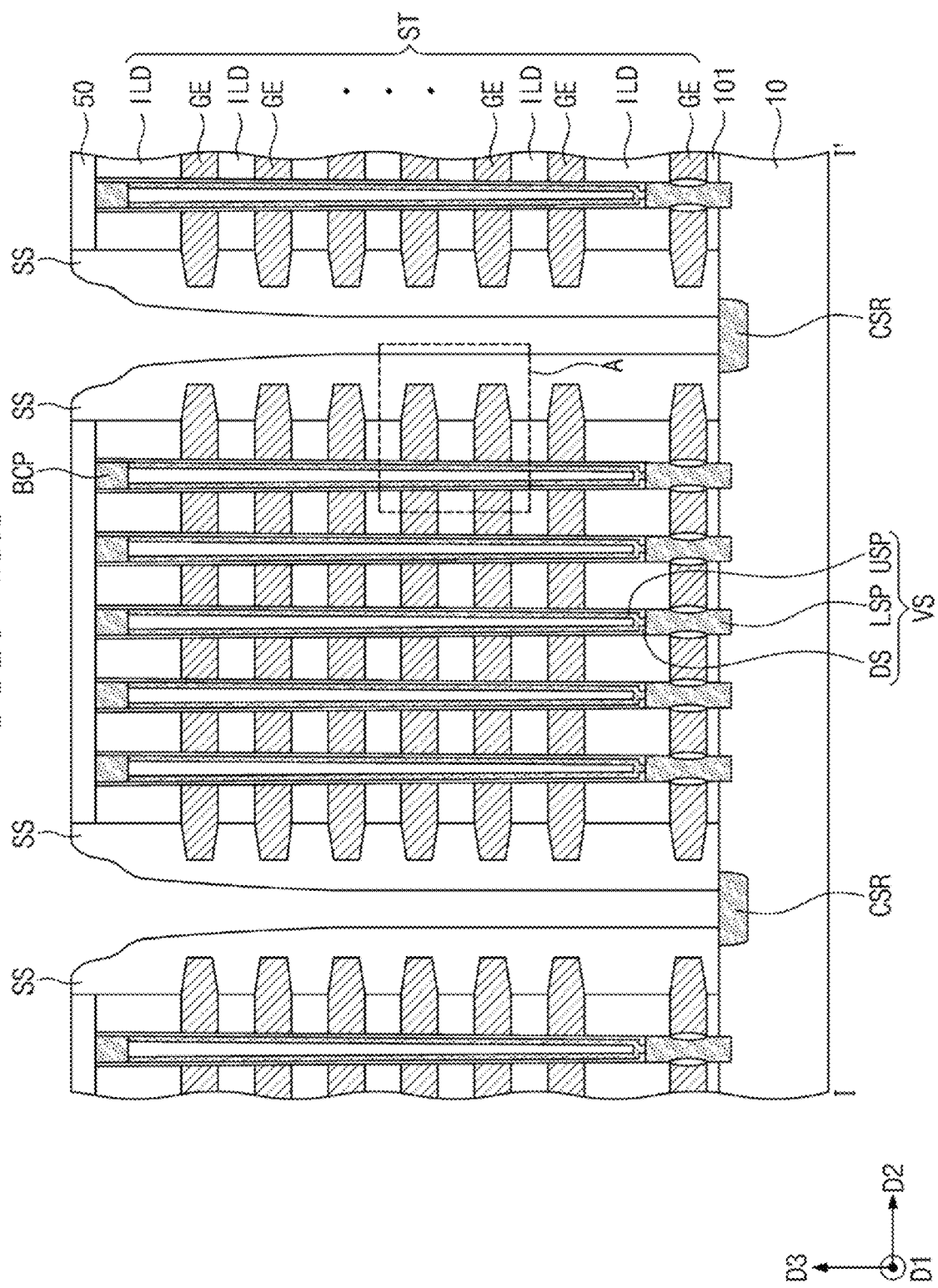
Figure 13B:
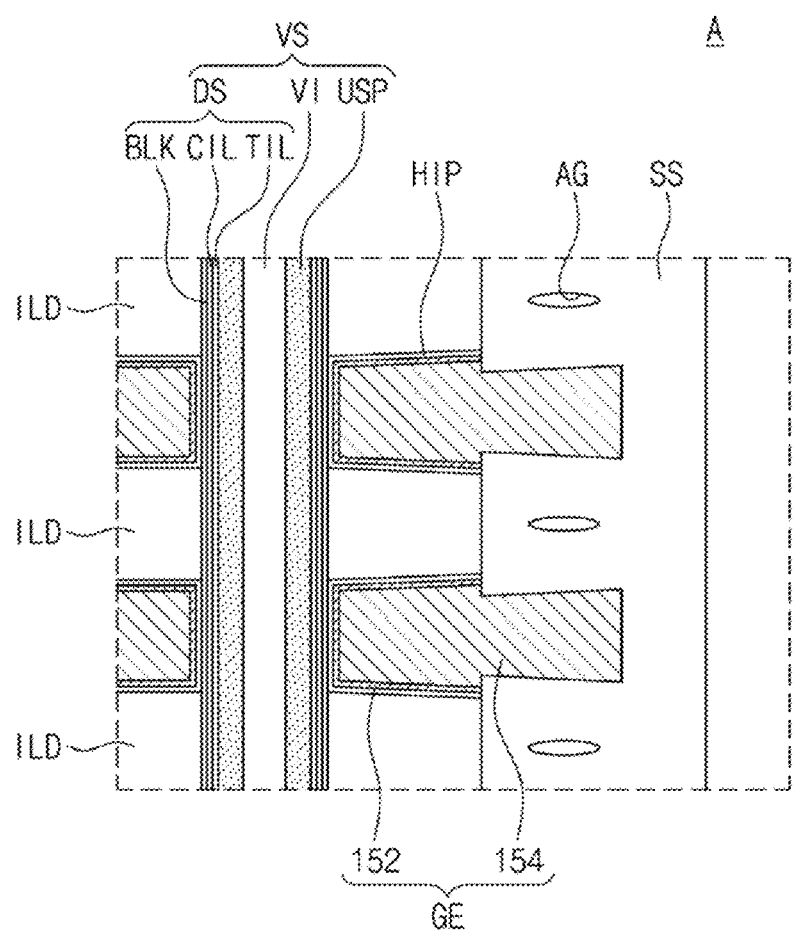

Referring to FIGS. 1, 13A, and 13B, after the gate electrodes GE are formed, the trenches T may be provided therein with insulating spacers SS that cover the sidewalls of the electrode structures ST.

The insulating spacer SS may be formed by depositing an insulating layer to fill the recess regions (see RS of FIGS. 12A and 12B) of the electrode structures ST and then etching the insulating layer covering the top surface of the substrate 10. For example, the etching of the insulating layer may include an anisotropic etching process to remove the insulating layer until the top surface of the substrate is exposed. When the insulating layer is deposited, an air gap AG may be formed in the recess region RS. The insulating spacer SS may be formed of, for example, silicon nitride ($Si_3N_4$), silicon oxide ($SiO_2$), silicon oxynitride (SiON), or a low-k dielectric material having a low dielectric constant. Alternatively, the insulating spacer SS may be formed by depositing on sidewalls of the gate electrodes GE an insulating layer exhibiting poor step coverage characteristics, with the result that the insulating spacer SS may be spaced apart from the sidewalls of the insulating layers ILD. Thus, in a three-dimensional semiconductor memory device fabricated with the method according to an exemplary embodiment of the present inventive concept described above, the gate electrodes GE may decrease in thickness at their outer portions (GEb, see FIGS. 3A and 3B) and/or air gap (see FIGS. 3B and 13B) may be formed between adjacent gate electrode GE at their outer portions (GEb, see FIG. 3B), such that an increase in capacitive coupling between outer portions GEb of the gate electrodes GE may be prevented.

FIGS. 14, 15, 16A to 18A, and 16B to 18B are cross-sectional views of section A of FIG. 2, showing a method of fabricating a three-dimensional semiconductor memory device according to an exemplary embodiment of the present inventive concept. Hereinafter, descriptions of technical features the same as those of the aforementioned method of fabricating a three-dimensional semiconductor memory device may be omitted for brevity of explanation.

As discussed above with reference to FIGS. 7A and 7B, the trenches T may be formed to penetrate the thin-layer structure 110, and the sacrificial layers SL may be removed to form the gate regions GR.

Figure 14:
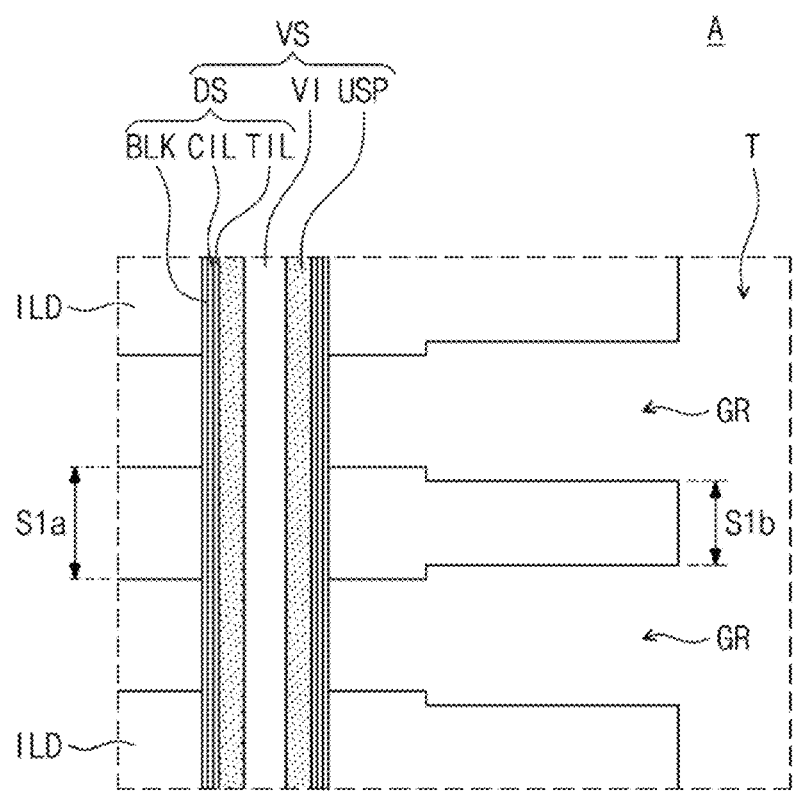

Referring to FIG. 14, the formation of the gate regions GR may include forming preliminary gate regions by partially removing the sacrificial layers SL exposed to the trenches T, reducing thicknesses of the insulating layers ILD by partially etching the insulating layers ILD exposed to the preliminary gate regions, and completely removing the sacrificial layers SL so as to partially expose the vertical structures VS and to form the gate regions GR. Accordingly, each of the insulating layers ILD may be thinner at its outer portion adjacent to the trench T than at its inner portion adjacent to the vertical structure VS (S1a>S1b). In addition, stepped portions may be formed between the outer and inner portions of the insulating layers ILD.

Figure 15:
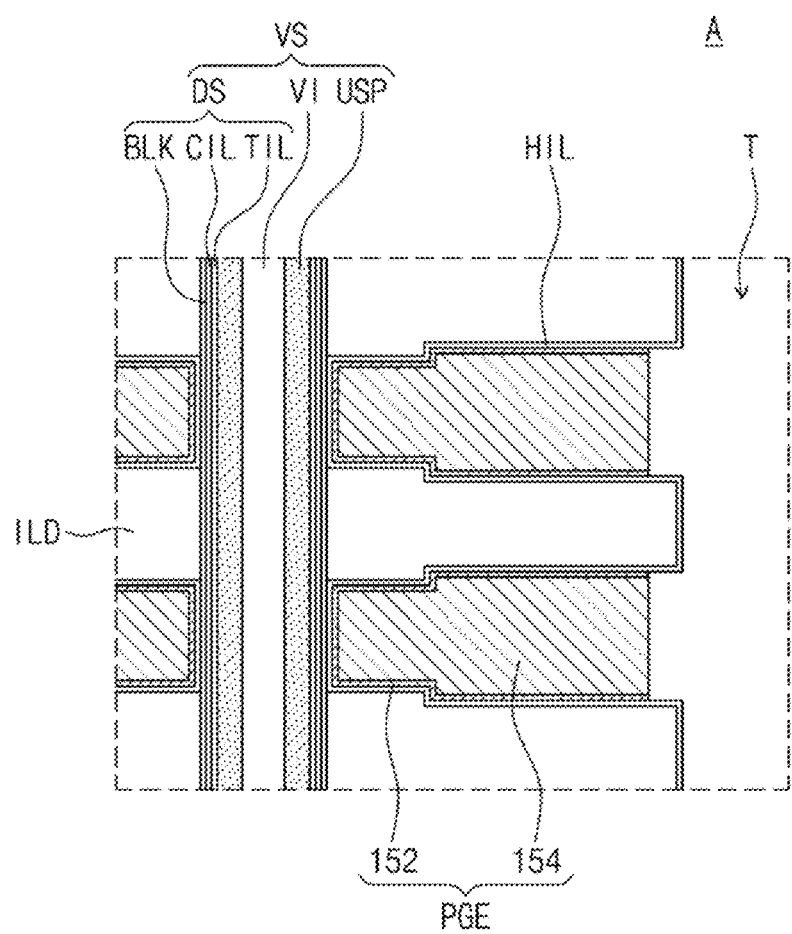

Referring to FIG. 15, the horizontal insulating layer HIL and the preliminary gate electrodes PGE may be formed in the gate regions GR. The trenches T may expose a portion of the horizontal insulating layer HIL deposited on the sidewalls of the insulating layers ILD. As discussed above with reference to FIGS. 10A and 10B, the preliminary gate electrodes PGE may be thicker at their outer portions adjacent to the trenches T than at their inner portions adjacent to the vertical structures VS. Each of the preliminary gate electrodes PGE may include the barrier metal pattern 152 and the metal pattern 154 sequentially stacked.

Figure 16A:
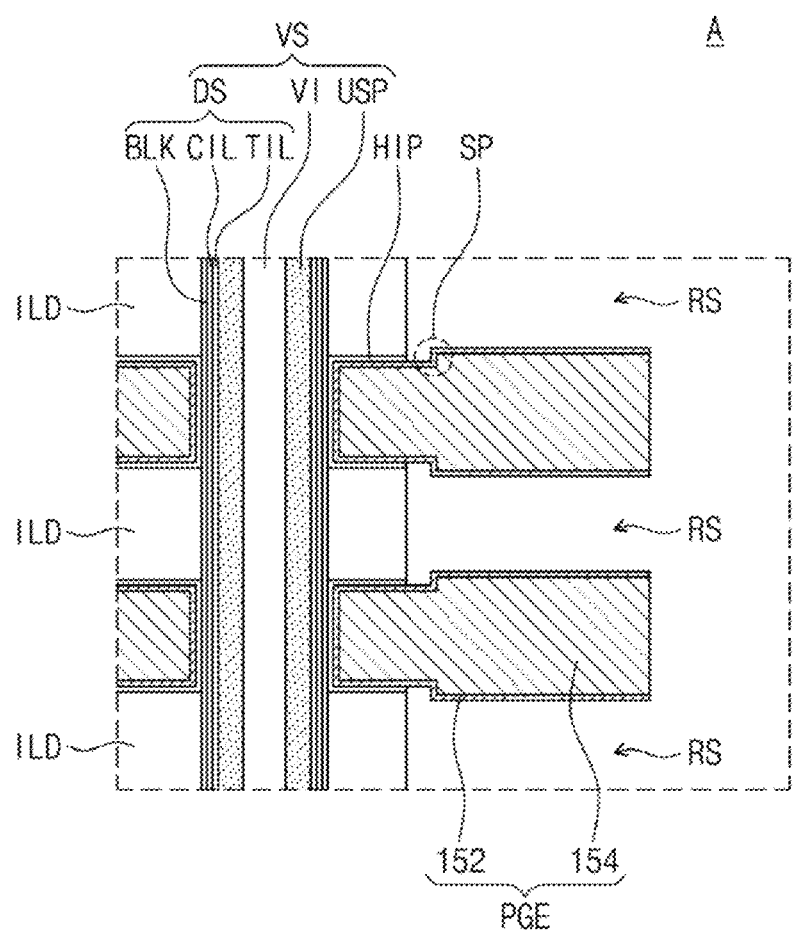
Figure 16B:
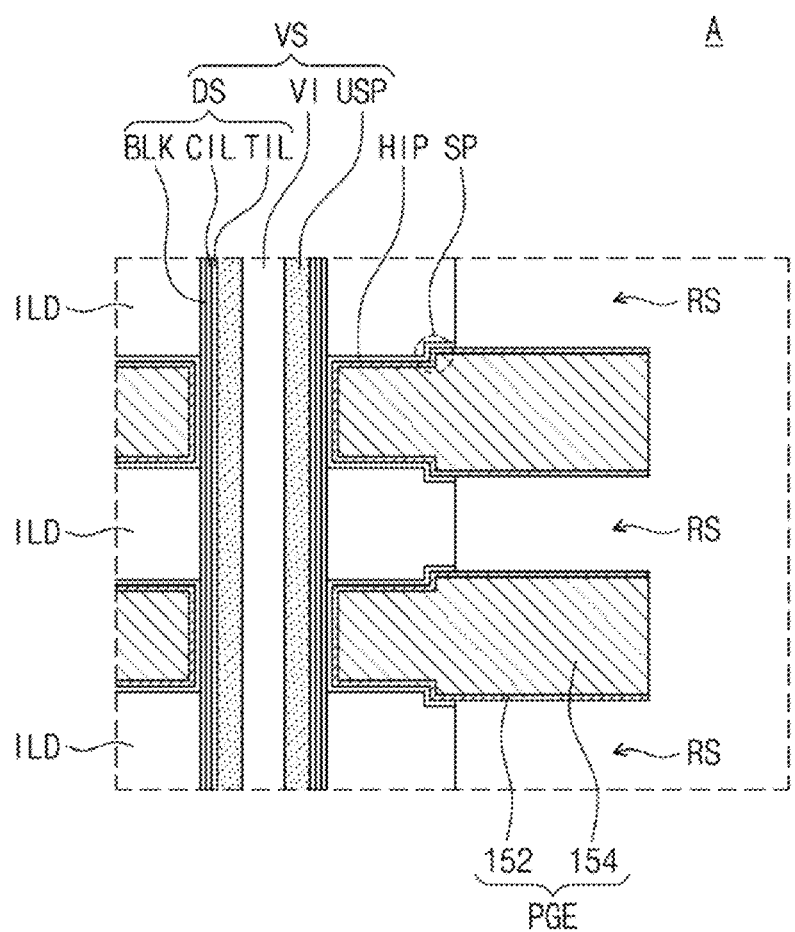

Referring to FIGS. 16A and 16B, the sidewalls of the insulating layers ILD may be recessed to form the recess regions RS between the preliminary gate electrodes PGE. Depending on horizontal depths of the recess regions RS, the stepped portions SP of the preliminary gate electrodes PGE may be covered by the insulating layers ILD or may be exposed to the recessed regions RS.

Figure 17A:
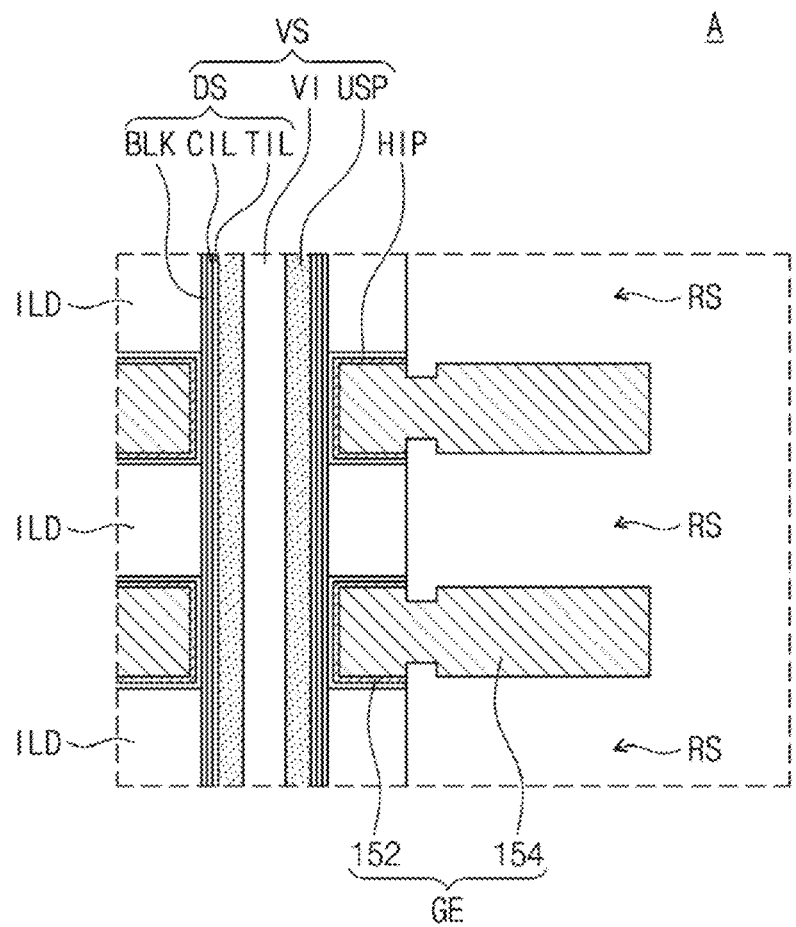
Figure 17B:
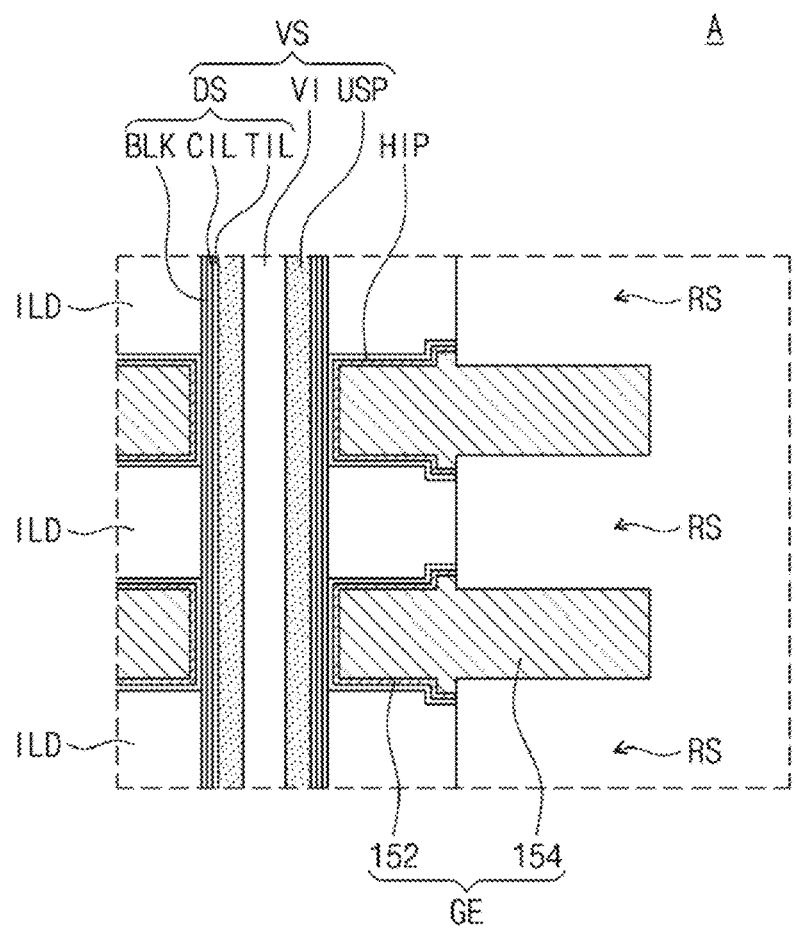

Referring to FIGS. 17A and 17B, as discussed above with reference to FIGS. 12A and 12B, an isotropic etching process may be performed on the preliminary gate electrodes PGE exposed to the recess regions RS. Accordingly, the gate electrodes GE may be formed to have thicknesses of their outer portions reduced. Depending on positions of the sidewalls of the insulating layers ILD, each of the gate electrodes GE may have a portion whose thickness is locally increased or reduced.

Figure 18A:
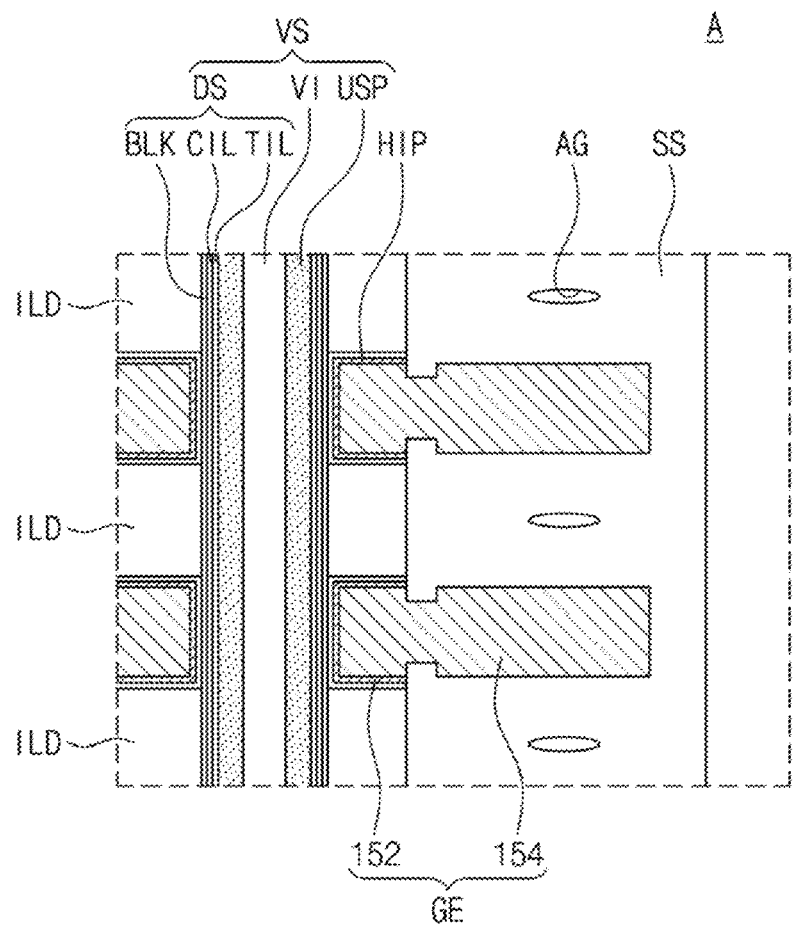
Figure 18B:
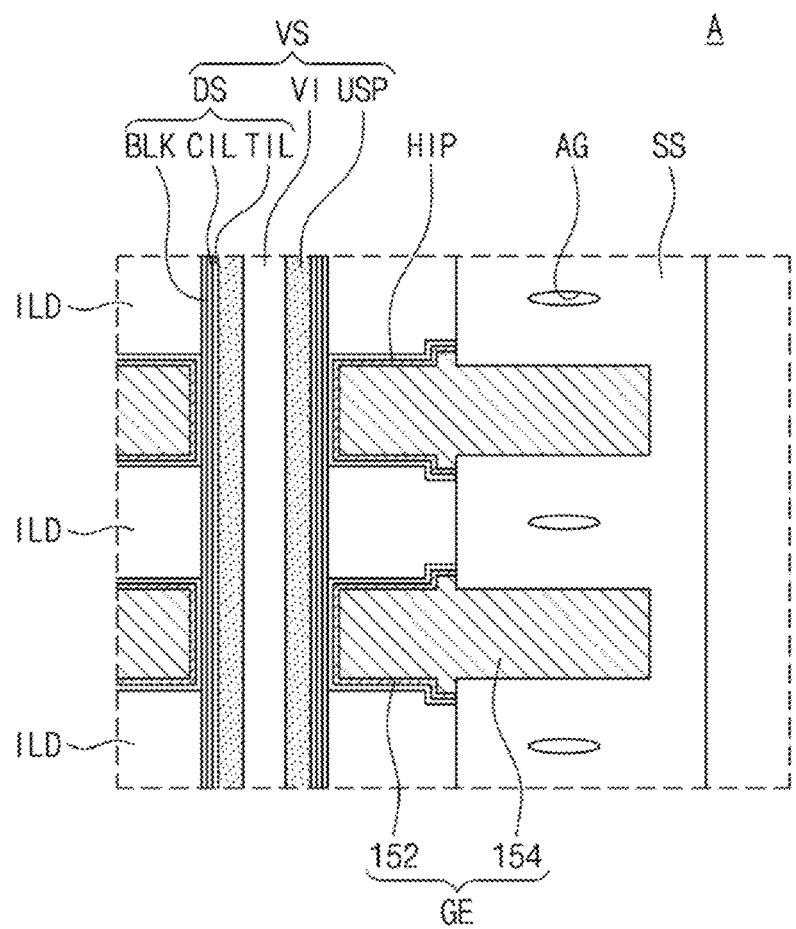

Referring to FIGS. 18A and 18B, as discussed above with reference to FIGS. 13A and 13B, the insulating spacer SS may be formed to fill between the gate electrodes GE adjacent to each other. When the insulating spacer SS is formed, air gaps AG may be formed in the recess regions RS.

Figure 19:
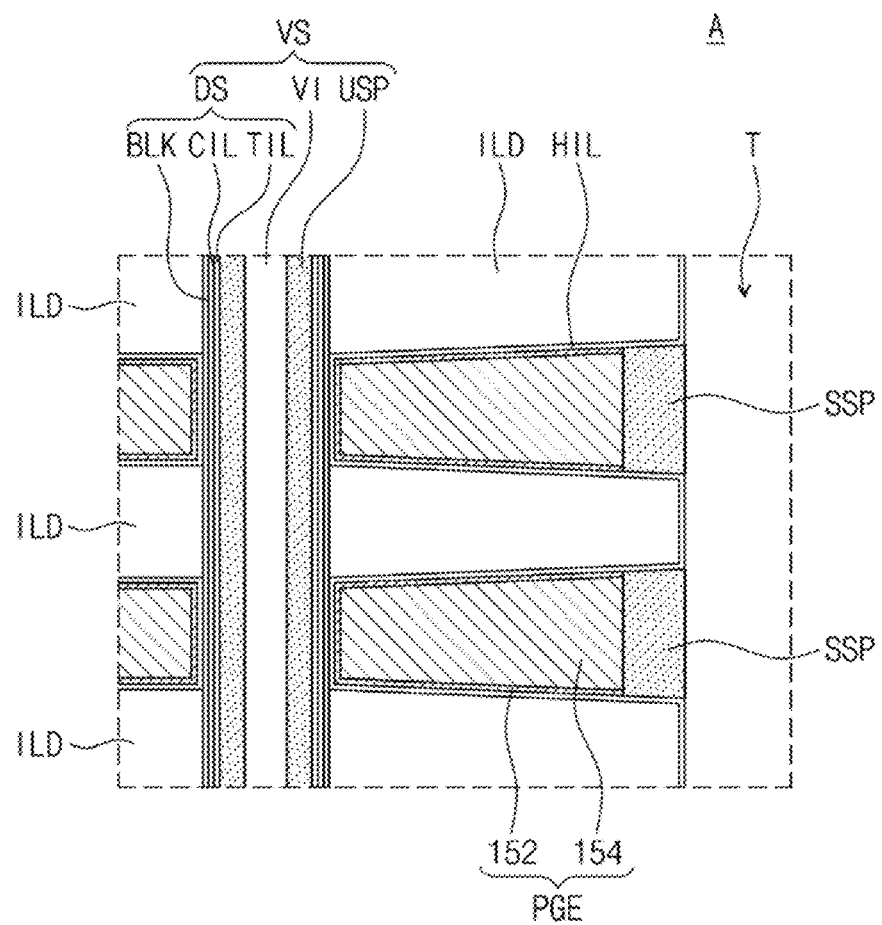
FIGS. 19 to 21 are cross-sectional views of section A of FIG. 2, showing a three-dimensional semiconductor memory device according to an exemplary embodiment of the present inventive concept.
Figure 20:
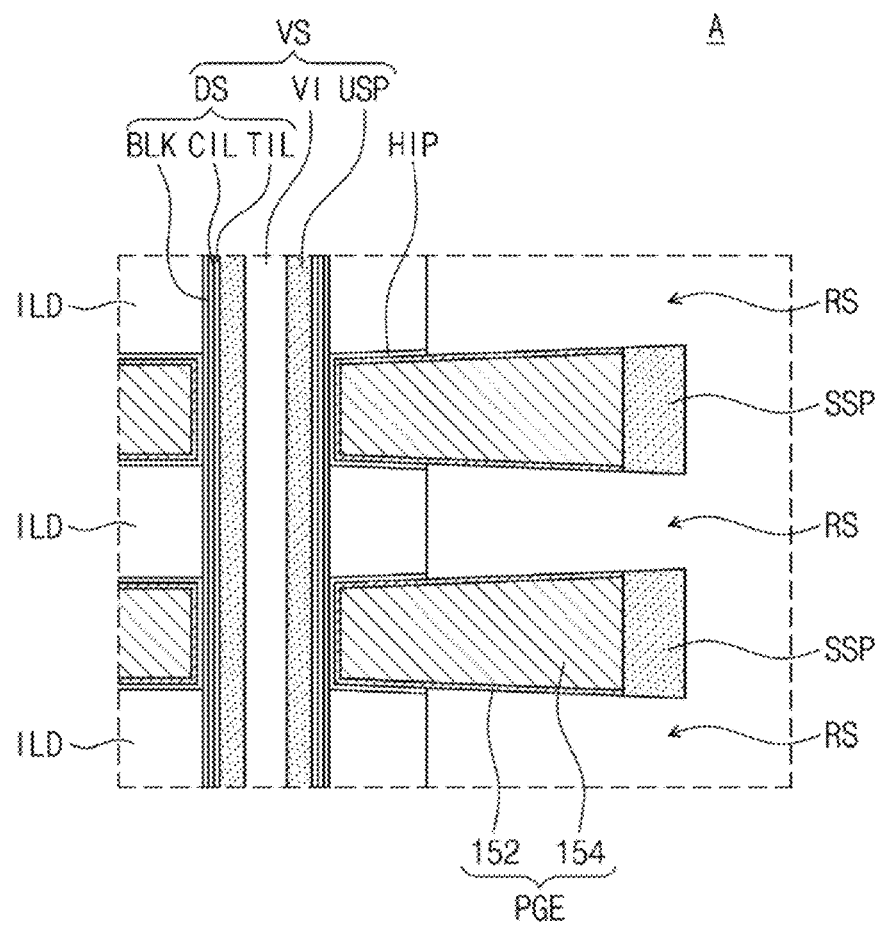
Figure 21:
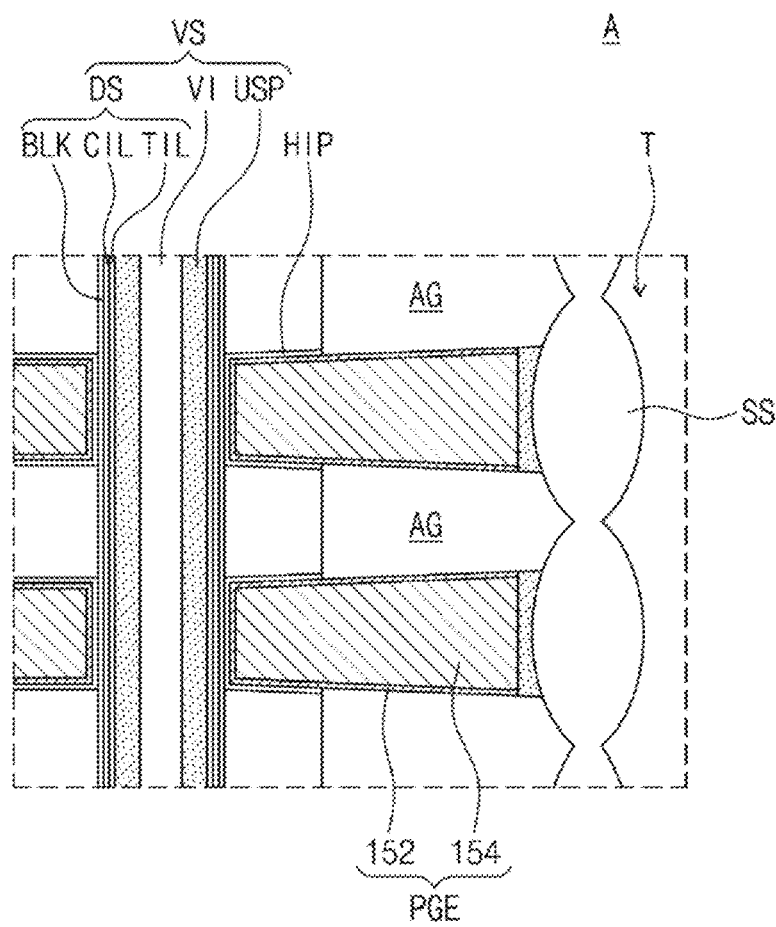

FIGS. 19 to 21 are cross-sectional views of section A of FIG. 2, showing a three-dimensional semiconductor memory device according to an exemplary embodiment of the present inventive concept.

As discussed above with reference to FIGS. 10A and 10B, the preliminary gate electrodes PGE may be formed in corresponding gate regions GR. The preliminary gate electrodes PGE may have sidewalls that are horizontally recessed more than the sidewalls of the insulating layers ILD.

Referring to FIG. 19, after the preliminary gate electrodes PGE are formed, side semiconductor patterns SSP may be formed on the sidewalls of the preliminary gate electrodes PGE to fill up the recessed portions surrounded by the sidewalls of the preliminary gate electrodes PGE and top and bottom surfaces of adjacent insulating layers ILD exposed by the trench T. The side semiconductor patterns SSP may be formed by depositing a semiconductor layer to cover inner sidewalls of the trenches T, and then anisotropically etching the semiconductor layer so as to expose the horizontal insulating layer HIL on the sidewalls of the insulating layers ILD. Accordingly, the side semiconductor patterns SSP formed may be vertically separated from each other.

Referring to FIG. 20, after the side semiconductor patterns SSP are formed, as discussed above with reference to FIGS. 11A and 11B, the recess regions RS may be formed by horizontally recessing the sidewalls of the insulating layers ILD exposed to the trenches T. Thus, the side semiconductor patterns SSP may be exposed on their sidewalls, top surfaces and bottom surfaces, and the preliminary gate electrodes PGE may be partially exposed on their top and bottom surfaces.

Referring to FIG. 21, the insulating spacers SS may be formed on sidewalls of the side semiconductor patterns SSP. The insulating spacers SS may be formed by performing a thermal oxidation process on the side semiconductor patterns SSP. Volume expansion may occur during the thermal oxidation of the side semiconductor patterns SSP. The insulating spacer SS may thus have a non-uniform thickness and a non-flat sidewall. The insulating spacer SS may be spaced apart from the sidewalls of the insulating layers ILD, and the air gaps AG may be formed between the insulating spacers SS and the sidewalls of the insulating layers ILD.

A common source plug (see CSP of FIG. 2) may be formed in the trench T in which the insulating spacer SS is formed, and before the common source plug CSP is formed, an anisotropic etching process may be performed on the insulating spacer SS having a non-uniform thickness.

In a method of fabricating a three-dimensional semiconductor memory device according to an exemplary embodiment of the present inventive concept, an insulating layer may decrease in thickness at its portion adjacent to a trench such that a metal layer may be deposited in gate regions without creating voids. In addition, after the metal layer is deposited, gate electrodes may decrease in thickness at their portions adjacent to the trench such that an increase in capacitive coupling between outer portions of the gate electrodes may be prevented. Accordingly, it may be advantageous to prevent reduction of breakdown voltage of the insulating layer between the outer portions of the gate electrodes. In conclusion, the three-dimensional semiconductor memory device may enhance in reliability and electrical characteristics.

Although the present inventive concept has been shown and described with reference to exemplary embodiments thereof, it will be understood to those skilled in the art that various changes and modifications may be made without departing from the spirit and scope thereof as defined by the appended claims.

What is claimed is:

1. A three-dimensional semiconductor memory device comprising:
   a plurality of electrode structures provided on a substrate and extending in parallel to each other in one direction, each of the plurality of electrode structures comprising electrodes and insulating layers alternately stacked on the substrate;

a plurality of vertical structures penetrating the plurality of electrode structures; and an electrode separation structure disposed between two of the plurality of electrode structures adjacent to each other, wherein each of the electrodes comprises:
an outer portion adjacent to the electrode separation structure; and
an inner portion adjacent to the plurality of vertical structures,
wherein a thickness of the outer portion is smaller than a thickness of the inner portion,
the inner portion and the outer portion are made of a same material,
a data storage pattern is located between the vertical structures and the insulating layers, and
the inner portion of each of the electrodes vertically overlaps each of the insulating layers.

2. The device of claim 1, wherein the outer portions of the electrodes horizontally protrude from sidewalls of the insulating layers.

3. The device of claim 1, wherein
the two of the plurality of electrode structures adjacent to each other have a sidewall on which recess regions, that are vertically spaced apart from each other, are formed,
sidewalls of the insulating layers are recessed to define the recess regions between the outer portions of the electrodes, respectively, and
the electrode separation structure comprises an insulating spacer that fills the recess regions and covers the sidewall of the two of the plurality of electrode structures adjacent to each other.

4. The device of claim 3, wherein each of the electrodes comprises a barrier metal pattern and a metal pattern,
wherein the metal pattern contacts the insulating spacer at the outer portion of each of the electrodes.

5. The device of claim 1, wherein each of the electrodes comprises:
a metal pattern; and
a barrier metal pattern extending from a region between each of the plurality of vertical structures and a sidewall of the metal pattern into regions between the insulating layers and the metal pattern,
wherein a thickness of the metal pattern is larger at the inner portion of each of the electrodes than at the outer portion of each of the electrodes.

6. The device of claim 5, wherein a sidewall of the barrier metal pattern is horizontally spaced apart from the sidewall of the metal pattern.

7. The device of claim 1, wherein the outer portions of the electrodes have sloped top and bottom surfaces.

8. The device of claim 1, wherein each of the electrodes comprises a stepped portion between the outer portion and the inner portion.

9. The device of claim 1, wherein the electrode separation structure comprises:
a common source plug that extends in parallel to extending directions of the plurality of electrode structures and is connected to the substrate; and
an insulating spacer disposed between the common source plug and a sidewall of the two of the plurality of electrode structures adjacent to each other,
wherein the insulating spacer covers top and bottom surfaces of the outer portions of the electrodes.

10. The device of claim 1, further comprising a horizontal insulating pattern that extends between each of the plurality of vertical structures and an inner sidewall of each of the electrodes and covers top and bottom surfaces of the inner portion of each of the electrodes,
wherein the horizontal insulating pattern is laterally spaced apart from an outer sidewall of each of the electrodes.

11. The device of claim 1, wherein a dielectric constant between the outer portions of the electrodes is smaller than a dielectric constant between the inner portions of the electrodes.

12. The device of claim 1, wherein the electrode separation structure comprises an insulating spacer covering a sidewall of the two of the plurality of electrode structures adjacent to each other,
wherein the insulating spacer comprises an air gap defined between the outer portions of the electrodes adjacent to each other.

13. The device of claim 1, wherein the electrode separation structure comprises an insulating spacer covering a sidewall of the two of the plurality of electrode structures adjacent to each other,
wherein the insulating spacer is spaced apart from sidewalls of the insulating layers and defines an air gap between the outer portions of the electrodes adjacent to each other.

14. A three-dimensional semiconductor memory device comprising:
an electrode structure comprising electrodes and insulating layers alternately stacked on a substrate, each of the electrodes comprising an outer portion horizontally protruding from sidewalls of the insulating layers; and
a plurality of vertical structures penetrating the electrode structure,
wherein each of the electrodes comprises:
a metal pattern; and
a barrier metal pattern that extends from a gap between each of the plurality of vertical structures and a sidewall of the metal pattern into gaps between the insulating layers and the metal pattern,
wherein a thickness of the metal pattern at the outer portion of each of the electrodes is smaller than a thickness of the metal pattern located between the insulating layers and vertically overlapping the insulating layers, and
a data storage pattern is located between the vertical structures and the insulating layers.

15. The device of claim 14, wherein a sidewall of the barrier metal pattern is horizontally spaced apart from the sidewall of the metal pattern.

16. The device of claim 14, further comprising an insulating spacer disposed on a sidewall of the electrode structure and protruding between the outer portions of the electrodes,
wherein the insulating spacer contacts the metal pattern.

17. The device of claim 14, further comprising:
a common source plug that extends in parallel to the electrode structure and is connected to the substrate; and
an insulating spacer disposed between the common source plug and a sidewall of the electrode structure,
wherein the insulating spacer covers top and bottom surfaces of the outer portions of the electrodes.

18. The device of claim 14, further comprising an insulating spacer that is spaced apart from the sidewalls of the insulating layers to define air gaps between the outer portions of the electrodes.

19. The device of claim 14, further comprising a horizontal insulating pattern disposed between each of the plurality of vertical structures and the barrier metal pattern, and between the insulating layers and the barrier metal pattern, wherein the horizontal insulating pattern is laterally spaced apart from an outer sidewall of the metal pattern.

20. A three-dimensional semiconductor memory device comprising:
a plurality of electrode structures extending in parallel to each other in a first direction on a substrate, each of the plurality of electrode structures comprising electrodes vertically stacked on the substrate;
a plurality of vertical structures penetrating the plurality of electrode structures; and
an electrode separation structure spaced apart from the plurality of vertical structures and on the substrate between two of the plurality of electrode structures adjacent to each other; and
a horizontal insulating pattern overlapping top and bottom surfaces of each of the electrodes and an inner sidewall of each of the electrodes, the inner sidewalls of the electrodes adjacent to the plurality of vertical structures, wherein each of the electrodes comprises:
an outer portion adjacent to the electrode separation structure; and
an inner portion adjacent to the plurality of vertical structures,
wherein a distance between the outer portions of the electrodes vertically adjacent to each other is greater than a distance between the inner portions of the electrodes vertically adjacent to each other, and
wherein the horizontal insulating pattern is laterally spaced apart from an outer sidewall of each of the electrodes, and the outer sidewalls of the electrodes are adjacent to the electrode separation structure, and
a data storage pattern is located between the vertical structures and the horizontal insulating pattern.

* * * * *